United States Patent
Tang et al.

(10) Patent No.: US 11,915,920 B2
(45) Date of Patent: Feb. 27, 2024

(54) EMITTER, ELECTRON GUN IN WHICH SAME IS USED, ELECTRONIC DEVICE IN WHICH SAME IS USED, AND METHOD FOR MANUFACTURING SAME

(71) Applicant: NATIONAL INSTITUTE FOR MATERIALS SCIENCE, Ibaraki (JP)

(72) Inventors: Jie Tang, Ibaraki (JP); Shuai Tang, Ibaraki (JP); Ta-Wei Chiu, Ibaraki (JP); Tadakatsu Ohkubo, Ibaraki (JP); Jun Uzuhashi, Ibaraki (JP); Kazuhiro Hono, Ibaraki (JP); Luchang Qin, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 81 days.

(21) Appl. No.: 17/768,017

(22) PCT Filed: Oct. 20, 2020

(86) PCT No.: PCT/JP2020/039310
§ 371 (c)(1),
(2) Date: Apr. 11, 2022

(87) PCT Pub. No.: WO2021/079855
PCT Pub. Date: Apr. 29, 2021

(65) Prior Publication Data
US 2022/0406552 A1 Dec. 22, 2022

(30) Foreign Application Priority Data

Oct. 21, 2019 (JP) ................................ 2019-191638
Dec. 12, 2019 (JP) ................................ 2019-224364

(51) Int. Cl.
*H01J 9/02* (2006.01)
*H01J 1/02* (2006.01)
*H01J 37/30* (2006.01)

(52) U.S. Cl.
CPC ................ *H01J 9/02* (2013.01); *H01J 1/02* (2013.01); *H01J 37/30* (2013.01)

(58) Field of Classification Search
CPC ................ H01J 9/02; H01J 1/02; H01J 37/30
See application file for complete search history.

(56) References Cited

U.S. PATENT DOCUMENTS 5,993,281 A 11/1999 Musket
7,828,622 B1 * 11/2010 Brodie .................... H01J 9/042
445/51

(Continued)

FOREIGN PATENT DOCUMENTS

JP 2008-204868 9/2008
JP 2011-91001 5/2011

(Continued)

OTHER PUBLICATIONS

Notice of Reasons for Refusal dated May 16, 2023 in corresponding Japanese Patent Application No. 2021-553437, with English language translation.

(Continued)

*Primary Examiner* — Anne M Hines
(74) *Attorney, Agent, or Firm* — Wenderoth, Lind & Ponack, L.L.P.

(57) ABSTRACT

The present invention provides a simpler method for sharpening a tip of an emitter. In addition, the present invention provides an emitter including a nanoneedle made of a single crystal material, an emitter including a nanowire made of a single crystal material such as hafnium carbide (HfC), both of which stably emit electrons with high efficiency, and an (Continued)

electron gun and an electronic device using any one of these emitters. A method for manufacturing the emitter according to an embodiment of the present invention comprises processing a single crystal material in a vacuum using a focused ion beam to form an end of the single crystal material, through which electrons are to be emitted, into a tapered shape, wherein the processing is performed in an environment in which a periphery of the single crystal material fixed to a support is opened.

21 Claims, 14 Drawing Sheets

(56) References Cited

U.S. PATENT DOCUMENTS

| | | |
|---|---|---|
| 2013/0248483 A1 | 9/2013 | Sugiyama et al. |
| 2018/0019091 A1 | 1/2018 | Tang et al. |
| 2020/0388458 A1 | 12/2020 | Tang et al. |

FOREIGN PATENT DOCUMENTS

| | | |
|---|---|---|
| JP | 2013-200991 | 10/2013 |
| JP | 2016-207319 | 12/2016 |
| WO | 2016/140177 | 9/2016 |
| WO | 2016/167048 | 10/2016 |
| WO | 2019/107113 | 6/2019 |

OTHER PUBLICATIONS

International Search Report dated Jan. 12, 2021 in International (PCT) Application No. PCT/JP2020/039310.
Singh et al., "Fabrication and characterization of a focused ion beam milled lanthanum hexaboride based cold field electron emitter source", Appl. Phys. Lett, 2018, vol. 113, pp. 093101-1 to 093101-4.
Mackie et al., "HfC(310) high brightness sources for advanced imaging applications", Journal of Vacuum Science & Technology B, vol. 32, No. 2, 2014, pp. 02B106-1 to 02B106-5.
Notice of Reasons for Refusal dated Jan. 17, 2023 in Japanese Patent Application No. 2021-553437, with English translation.
Extended European Search Report dated Nov. 21, 2023 in European Patent Application No. 20879034.5.

* cited by examiner

Fig. 3
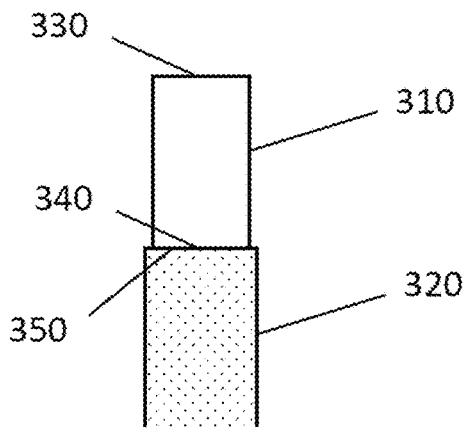
(a)
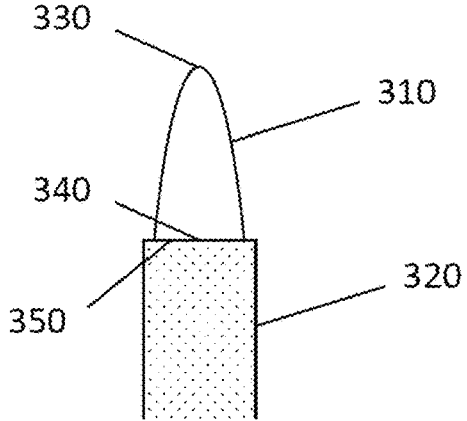
(b)
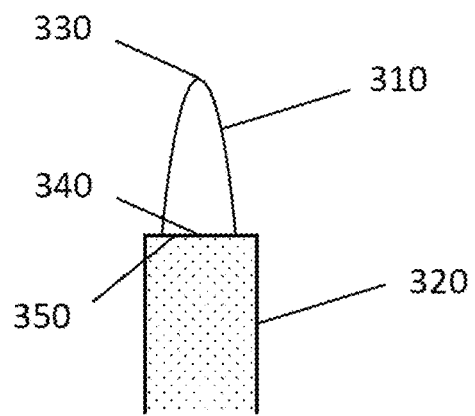
(c)

Fig. 7
(a)
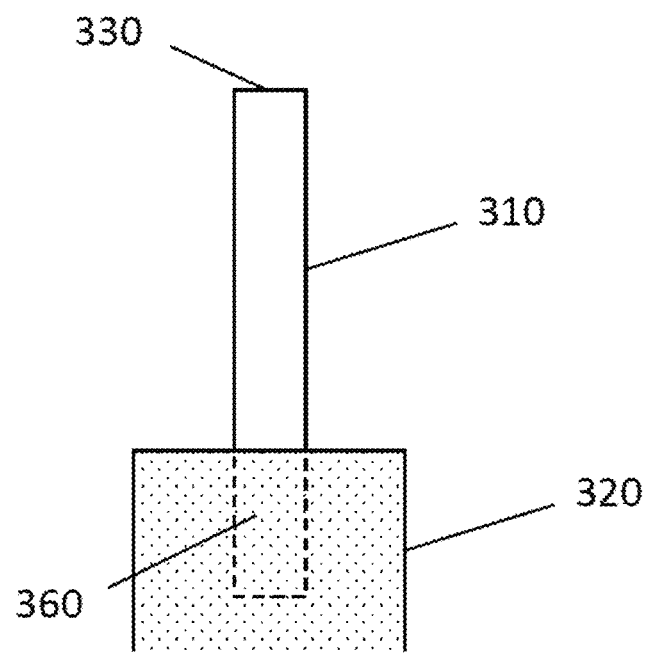
(b)
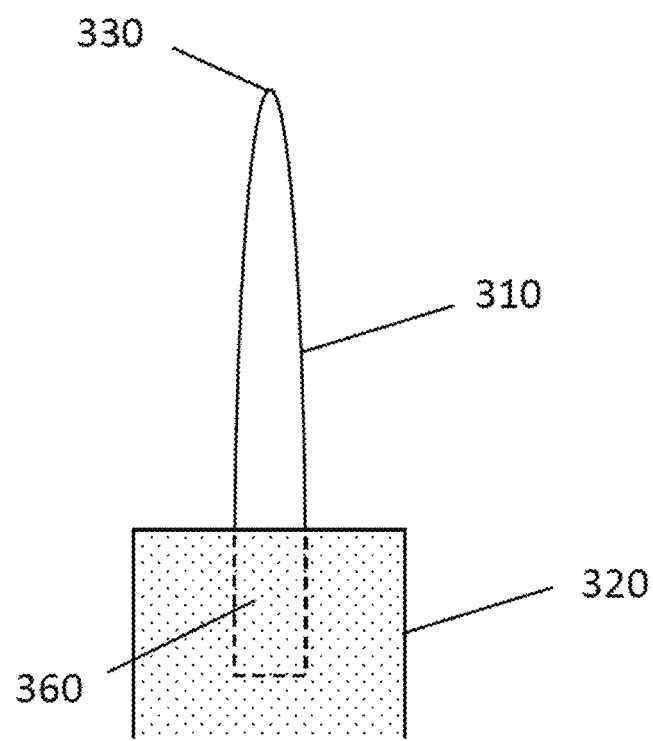

Fig. 11
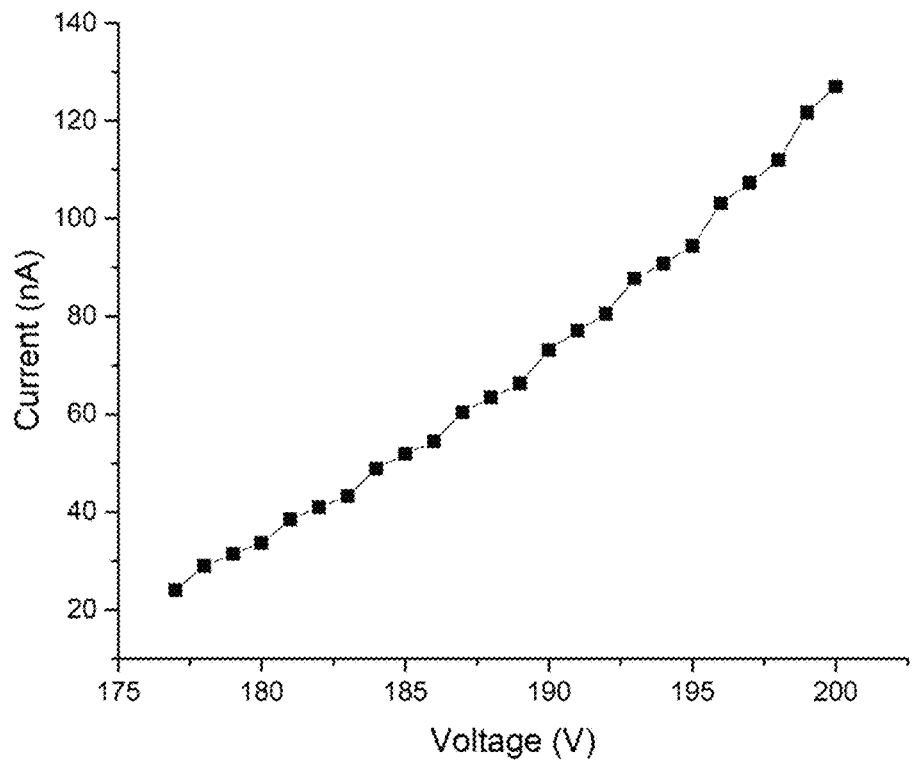
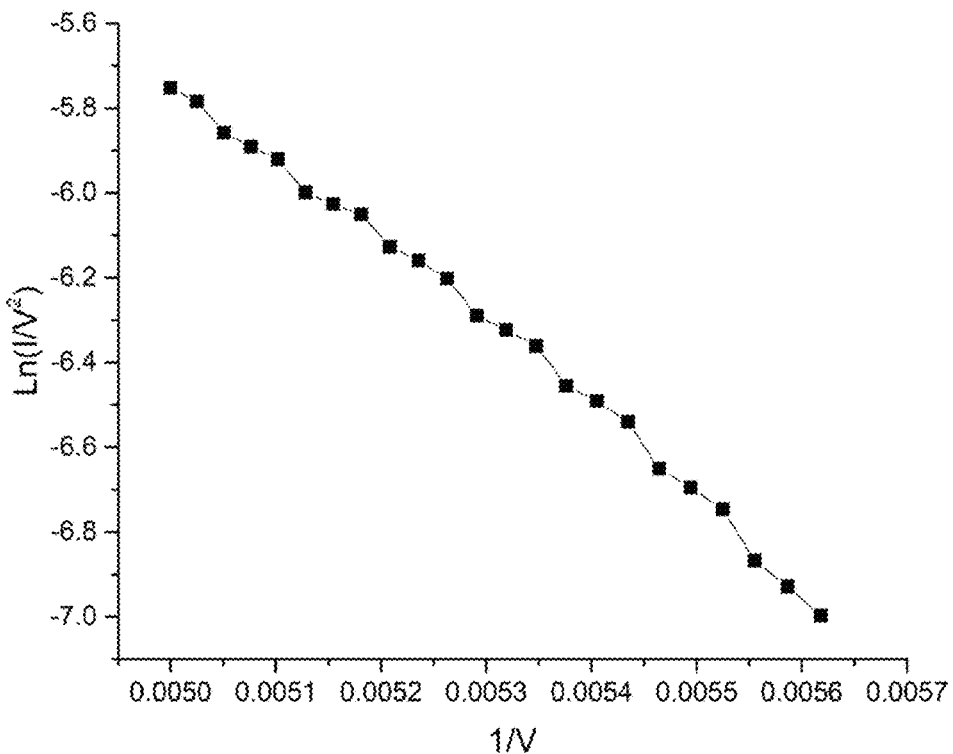

Fig. 15
(a)
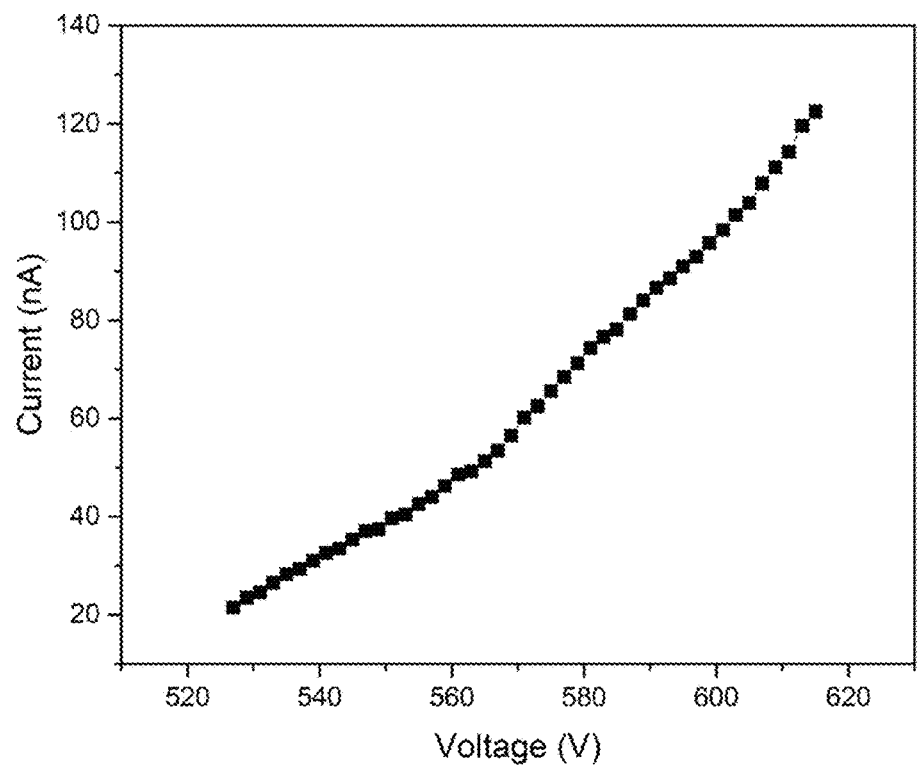
(b)
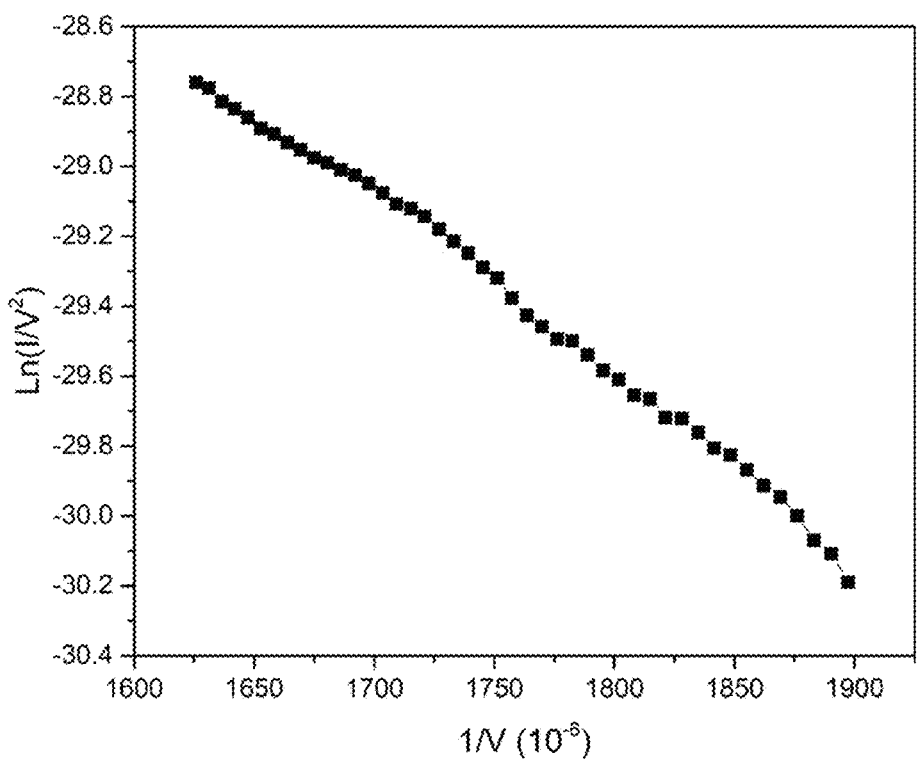

Fig. 18
(a)
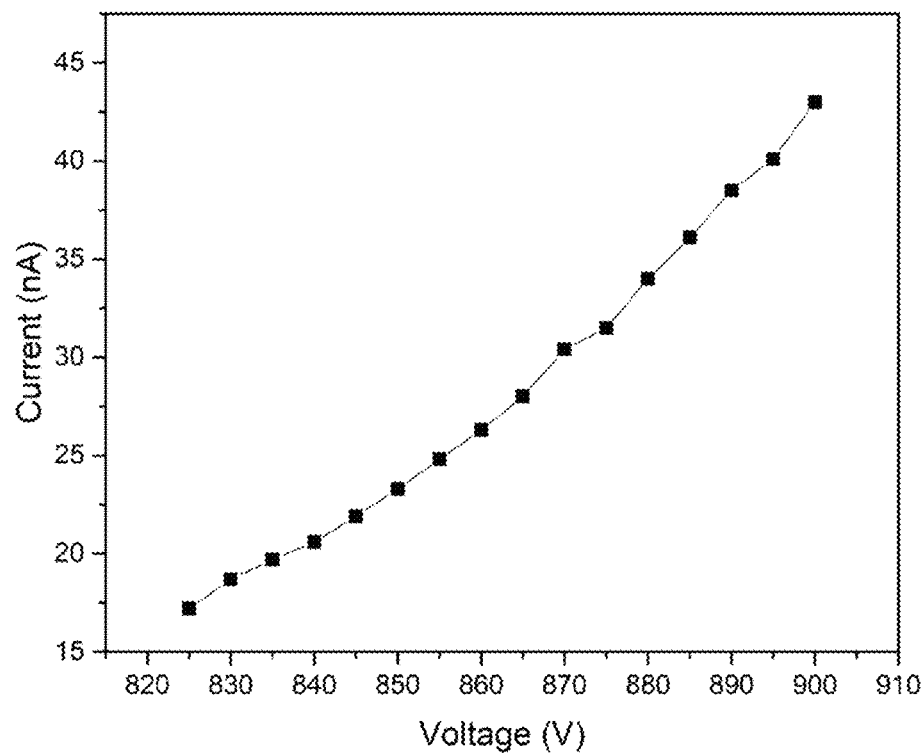
(b)
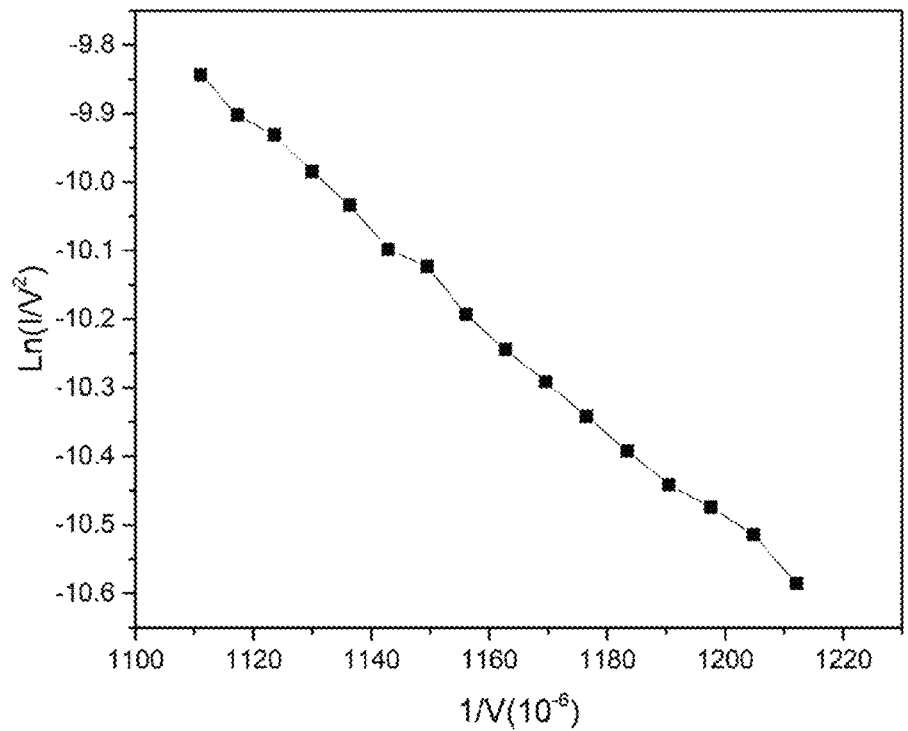

EMITTER, ELECTRON GUN IN WHICH SAME IS USED, ELECTRONIC DEVICE IN WHICH SAME IS USED, AND METHOD FOR MANUFACTURING SAME

TECHNICAL FIELD

The present invention relates to an emitter, an electron gun using the emitter, an electronic device using the emitter, and a method for manufacturing the emitter. More specifically, the present invention relates a nanoneedle emitter and a nanowire emitter, an electron gun and an electronic device using any one of these emitters, and a method for manufacturing any one of these emitters.

BACKGROUND ART

Various improvements have been made to electron guns used in electron microscopes in order to obtain a high-resolution and high-brightness observation image. Examples of an electron source using such an electron gun include a field emission-type electron source, a Schottky-type electron source, and the like. These are characterized in that the tip of an emitter used in an electron gun is sharpened to generate an electric field concentrating effect at the tip and to emit more electrons through the tip.

As a method for processing the tip of the emitter, wet etching has been conventionally known. For example, Non-Patent Literature 1 describes fabrication of an $LaB_6$ single crystal by a method combining electrochemical etching and focused ion beam milling. In addition, Non-Patent Literature 2 describes processing of a hafnium carbide (HfC) single crystal rod into a rounded shape by electrochemical etching.

CITATION LIST

Patent Literature

Patent Literature 1: US 5,993,281
Patent Literature 2: WO 2016/140177 A
Patent Literature 3: WO 2019/107113 A

Non-Patent Literature

Non-Patent Literature 1: Gopal Singh et al., Fabrication and characterization of a focused ion beam milled lanthanum hexaboride based cold field electron emitter source, Appl. Phys. Lett. 113, 093101 (2018).
Non-Patent Literature 2: William A. Mackie et al., HfC (310) high brightness sources for advanced imaging applications, Journal of Vacuum Science & Technology B 32, 02B106 (2014).

SUMMARY OF INVENTION

Technical Problem

According to Non-Patent Literature 1, by combining the above two kinds of methods (electrochemical etching and focused ion beam milling), the number of fabricating steps of the $LaB_6$ single crystal can be reduced while maintaining reproducibility. However, since electrochemical etching is a fabrication method using a dissolution (corrosion) action by an etchant, it is difficult to completely eliminate the possibility that surface contamination occurs or stoichiometric composition becomes disproportional in the emitter material subjected to electrochemical etching. Thus, there is a concern that the performance of the emitter is impaired by these undesirable phenomena. In this regard, milling fabrication using a focused ion beam may remove defects on the surface of the fabricated portion, but cannot remove defects generated in other portions.

On the other hand, Patent Literature 1 states that an ion beam having predetermined energy is directed such that ions are incident on a longitudinal axis of an emitter, and a tip (upper end) of the emitter is irradiated with the ion beam, thereby milling the tip of the emitter. However, in the case of the method described in Patent Literature 1, the device configuration becomes complicated in order to control the incident direction of the ion beam with respect to the emitter, and thus this method is less practical.

In recent years, an emitter composed of a hafnium carbide single crystal nanowire coated with hafnium oxide has been developed (for example, see Patent Literature 2). In addition, an emitter composed of a hafnium carbide single crystal nanowire has been developed, in which a longitudinal direction of the nanowire corresponds to a <100> crystal direction of the hafnium carbide single crystal, an end of the nanowire, through which electrons are to be emitted, has a (200) plane and a {311} plane(s) of the hafnium carbide single crystal, the (200) is centered, and the {311} plane(s) surrounds the (200) plane (for example, see Patent Literature 3). Furthermore, an emitter composed of a hafnium carbide single crystal nanowire coated with hafnium oxycarbide ($HfC_{1-x}O_x$: $0<x \leq 0.5$) has been developed (for example, see the specification of PCT/J P2020/0254235).

However, there is probability for further improvement regarding stability of electron emission characteristics (electron emission is also referred to as "field electron emission" or "field emission") from the hafnium carbide nanowire emitters described in Patent Literature 2, Patent Literature 3 and the above-mentioned specification.

In view of the above circumstances, an object of the present invention is to provide a simpler method for sharpening the tip of the emitter.

Another object of the present invention is to provide an emitter including a nanoneedle made of a single crystal material that stably emits electrons with high efficiency, and an electron gun and an electronic device using the emitter.

Still another object of the present invention is to provide an emitter including a nanowire made of a single crystal material such as hafnium carbide (HfC) that stably emits electrons with high efficiency. Still another object of the present invention is to provide a method for manufacturing the emitter, and an electron gun and an electronic device using the emitter.

Solution to Problem

As a result of intensive studies to solve the above problems, the inventors of the present application have found that an emitter whose tip is sharpened in a vacuum using a focused ion beam in an environment in which the periphery of a single crystal material is opened, without being subjected to chemical treatment such as conventional etching, has excellent electron emission characteristics. Based on the above, the inventors have completed the present invention.

That is, as a result of intensive studies to solve the above problems, the inventors of the present application have found that an emitter prepared by a manufacturing method different from conventional methods as described in Patent Literature 2, Patent Literature 3, and the above-described description has excellent electron emission characteristics. Based on the above, the inventors have completed the present invention.

A method for manufacturing an emitter according to the present invention includes processing a single crystal material in a vacuum using a focused ion beam to form an end of the single crystal material, through which electrons are to be emitted, into a tapered shape, the processing being performed in an environment in which a periphery of the single crystal material fixed to a support is opened, thereby solving the above problems.

In the method for manufacturing an emitter according to the present invention, the single crystal material may be chemically untreated.

An end face opposite to the end of the single crystal material may be fixed to a support face of the support.

The processing the single crystal material may include setting a radius of curvature $r_N$ of a tip of the end to a value of 80% or less of a length $d_N$ of the single crystal material in a lateral direction.

In the processing the single crystal material, the single crystal material may be thinned toward the end by setting irradiation conditions of the focused ion beam such that a current is 200 to 800 pA, a voltage is 20 to 40 kV, a position to be irradiated is moved scanning in a direction from an outer side to an inner side of the single crystal material, and irradiation time is 0.5 to 30 minutes, and thereafter the radius of curvature $r_N$ of the tip of the end may be set to a value of 20% or less of the length $d_N$ of the single crystal material in the lateral direction by setting the irradiation conditions of the focused ion beam such that a current is 10 to 100 pA, a voltage is 2 to 10 kV, a position to be irradiated is moved scanning in a direction from an outer side to an inner side of the single crystal material, and irradiation time is 0.5 to 10 minutes.

An emitter according to the present invention includes a nanoneedle made of a single crystal material. The nanoneedle has substantially no change in a stoichiometric composition except for an inevitable oxide layer at a surface layer portion, and a field electron emission pattern, obtained by a field emission microscope (FEM), at an end of the nanoneedle, through which electrons are to be emitted, is a single spot, thereby solving the above problems.

The nanoneedle may be manufactured by the above-described method.

The emitter may further include a support needle. An end face opposite to the end of the nanoneedle may be fixed to a support face of the support needle made of an element selected from the group consisting of tungsten (W), tantalum (Ta), platinum (Pt), rhenium (Re), and carbon (C).

The single crystal material may be a rare-earth hexaboride.

In the method for manufacturing the emitter according to the present invention, the single crystal material may be a single crystal nanowire.

The processing the single crystal material may include setting a radius of curvature $r_W$ of a tip of the end to a value of 50% or less of a length $d_W$ of the single crystal nanowire in a lateral direction.

In the processing the single crystal material, the single crystal nanowire may be thinned toward the end, and the radius of curvature $r_W$ of the tip of the end may be set to a value of 50% or less of the length $d_W$ of the single crystal nanowire in the lateral direction, by setting irradiation conditions of the focused ion beam such that a current is 20 to 100 pA, a voltage is 2 to 10 kV, a position to be irradiated is moved scanning in a direction from an outer side to an inner side of the single crystal nanowire, and irradiation time is 0.5 to 5 minutes.

An emitter according to the present invention includes a single crystal nanowire manufactured by the method described above. A field electron emission pattern, obtained by a field emission microscope (FEM), at an end of the single crystal nanowire, through which electrons are to be emitted, is a single spot, thereby solving the above problems.

The single crystal nanowire may be made of a metal carbide, a rare-earth boride, or a metal oxide.

The single crystal nanowire may be made of hafnium carbide (HfC).

The emitter according to the present invention may be used in an electron gun.

An electron gun including at least an emitter according to the present invention, in which the emitter is the emitter including the nanoneedle made of the single crystal material described above, or the emitter including the single crystal nanowire described above, thereby solving the above problems.

The emitter may further include a support needle and a filament, and the nanoneedle or the single crystal nanowire may be attached to the filament via the support needle made of an element selected from the group consisting of tungsten (W), tantalum (Ta), platinum (Pt), rhenium (Re), and carbon (C).

The electron gun may be a cold cathode field emission electron gun or a Schottky electron gun.

An electronic device including an electron gun according to the present invention, in which the electron gun is the electron gun described above, and the electronic device is selected from the group consisting of a scanning electron microscope, a transmission electron microscope, a scanning transmission electron microscope, an electron diffractometer, an Auger electron spectrometer, an electron energy loss spectrometer, and an energy dispersive electron spectrometer, thereby solving the above problem.

Advantageous Effects of Invention

According to the present invention, a simpler method for sharpening the tip of the emitter can be provided.

In addition, according to the present invention, an emitter made of a single crystal material that stably emits electrons with high efficiency, and an electron gun and an electronic device using the emitter can be provided.

Further, according to the present invention, an emitter including a nanowire made of a single crystal material such as hafnium carbide (HfC) that stably emits electrons with high efficiency can be provided.

Furthermore, according to the present invention, a method for manufacturing the emitter, and an electron gun and an electronic device using the emitter can be provided.

BRIEF DESCRIPTION OF DRAWINGS

FIGS. 3(a), 3(b), and 3(c) are schematic views showing a method for manufacturing the emitter according to Embodiment 1: (a) a schematic view showing a state before processing using a focused ion beam, (b) a schematic view showing a state after processing by irradiation with a focused ion beam under a first condition, and (c) a schematic view showing a state after processing by irradiation with a focused ion beam under a second condition.

FIGS. 7(a), and 7(b) are schematic views showing a method for manufacturing the emitter according to Embodiment 3: (a) a schematic view showing a state before processing using a focused ion beam, and (b) a schematic view showing a state after processing using a focused ion beam.

FIG. 11 is a group of graphs indicating field emission characteristics of the emitter according to Example 1: (a) a graph of a field emission current obtained by changing an extraction voltage from 177 V to 200 V in increments of 1 V (a graph indicating V-I characteristics), and (b) a Fowler-Nordheim (F-N) plot obtained from the result of (a).

FIG. 15 is a group of graphs indicating field emission characteristics of the emitter according to Example 2-1: (a) a graph of a field emission current obtained by changing an extraction voltage from 527 V to 615 V in increments of 2 V (a graph indicating V-I characteristics), and (b) a Fowler-Nordheim (F-N) plot obtained from the result of (a).

FIG. 18 is a group of graphs indicating field emission characteristics of the emitter according to Example 2-2: (a) a graph of a field emission current obtained by changing an extraction voltage from 825 V to 900 V in increments of 5 V (a graph indicating V-I characteristics), and (b) a Fowler-Nordheim (F-N) plot obtained from the result of (a).

DESCRITPION OF EMBODIMENTS

Figure 1:
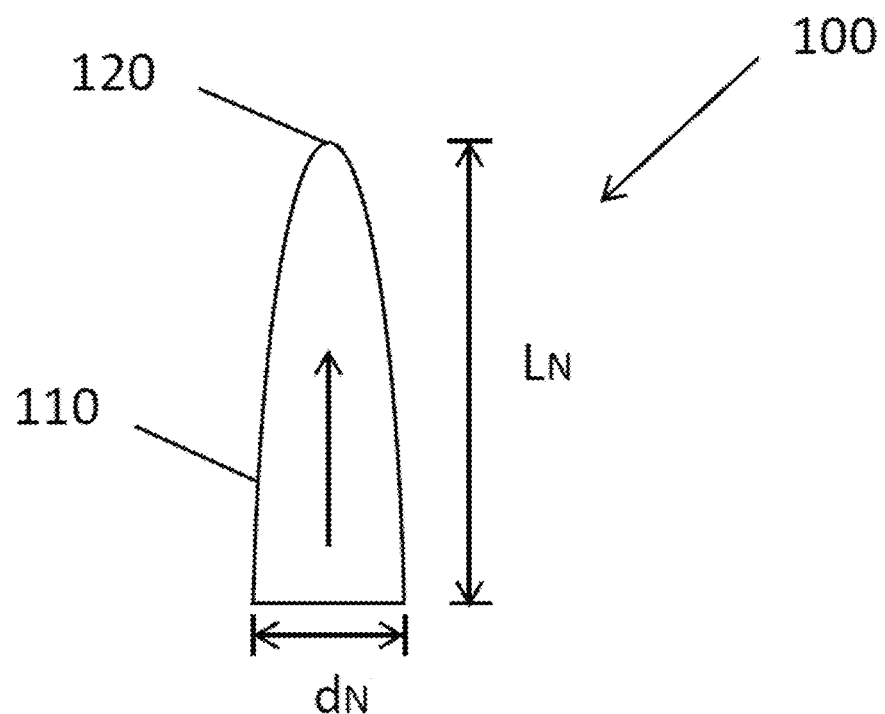
FIG. 1 is a schematic view of an emitter according to Embodiment 1.

Hereinafter, embodiments according to the present invention will be described with reference to the drawings. Note that the same reference numerals will be given to the same elements, and a description thereof will not be repeated.

<Nanoneedle Emitter, Electron Gun using the Same, Electronic Device using the Same, and Method for Manufacturing the Same>

Embodiment 1

In Embodiment 1, a nanoneedle emitter according to the present invention and a method for manufacturing the same will be described.

FIG. 1 is a schematic view of an emitter according to Embodiment 1.

As shown in FIG. 1, the emitter according to the present embodiment includes a nanoneedle 100, and the nanoneedle 100 is made of a single crystal material 110. The nanoneedle 100 (single crystal material 110) has substantially no change in stoichiometric composition except for an inevitable oxide layer (not shown) at a surface layer portion (more specifically, for example, a surface layer portion of an end 120 through which electrons are to be emitted, and the like). In addition, the nanoneedle 100 (single crystal material 110) has a tapered shape toward the end 120 through which electrons are to be emitted. Therefore, in the emitter according to the present embodiment, the work function of the end 120 of the nanoneedle 100 (i.e., the single crystal material 110), through which electrons are to be emitted, is low, and electrons can be easily emitted. As a result, in the emitter according to the present embodiment, a field electron emission pattern at the end 120 obtained by a field emission microscope (FEM) is a single spot, and the emitter is excellent in electron emission characteristics.

In the present description, the nanoneedle is intended to have a needle shape (acicular shape) on the order of nanometers. In the present embodiment, the section of the nanoneedle 100 is not particularly limited, and may be, for example, circular, elliptical, rectangular, or polygonal, or may have an irregular shape. In addition, the external appearance shape of the nanoneedle 100 is not particularly limited, and may be, for example, conical, cylindrical, or polyhedral, or may have an irregular shape.

The single crystal material 110 is not particularly limited as long as it is a metal single crystal or a compound single crystal and can be used as a material of an electron gun. Specific examples thereof include rare-earth hexaborides ($LaB_6$, $GdB_6$, $CeB_6$, and the like), metal carbides (ZrC, HfC, NbC, TiC, TaC, VC, and the like), metal oxides (ZnO, CuO, $WO_3$, and the like), high-melting-point metals (W, Mo, Ta, and the like), graphite, and Si contented compounds.

In the present description, when the wording "have substantially no change in stoichiometric composition" is used regarding the nanoneedle 100, it is intended that the single crystal material 110 constituting the nanoneedle 100 has substantially no change from the stoichiometric composition. Specifically, for example, when the element distribution is analyzed by mapping using STEM-EDS (STEM-EDS mapping) or the like, the nanoneedle 100 (single crystal material 110) of the present embodiment has substantially no variation in element distribution and is evaluated to have a uniform element distribution. Additionally, the emitter according to the present invention can stably emit electrons with high efficiency as shown in examples described later due to having substantially no change in stoichiometric composition.

The longitudinal direction (the direction indicated by the upward arrow in FIG. 1) of the nanoneedle 100 preferably corresponds to a specific crystal direction of the crystal structure of the single crystal material 110. In this way, a favorable single crystal with few cracks, kinks, and the like can be secured as the single crystal material 110 in the nanoneedle 100. In addition, since the crystal plane of the end 120 through which electrons are to be emitted including a low work function plane, electrons can be efficiently emitted. For example, in a case where the single crystal material 110 is $LaB_6$, the end 120 through which electrons are to be emitted preferably includes a plain having a low work function, such as a <100> plane. Further, in a case where the single crystal material 110 is HfC, the end 120 through which electrons are to be emitted preferably includes a plain having a low work function, such as a <111> plane or a <110> plane. The crystal direction of the single crystal material 110, to which the longitudinal direction of the nanoneedle 100 corresponds, may be selected from the viewpoint of ease of manufacturing and processing, quality of a crystal, and the like.

Preferably, a length $d_N$ of the nanoneedle 100 in the lateral direction (i.e., the diameter of the nanoneedle 100) is in the range of 1 nm or more and 50 µm or less, and a length $L_N$ in the longitudinal direction is in the range of 5 nm or more and 100 µm or less. With such a size, electric field concentration on the end 120 through which electrons are to be emitted can be effectively generated, thereby allowing the end 120 to emit more electrons. Note that, in a case where the section of the nanoneedle 100 is not circular, for example, in a case where the section of the nanoneedle 100 is rectangular, the length $d_N$ in the lateral direction refers to the length of the shorter side of the rectangle. Alternatively, in a case where the section of the nanoneedle 100 is polygonal, the diameter of the circle inscribed by the polygon (or the minor axis of the ellipse) may be set as the length $d_N$ in the lateral direction.

More preferably, the length $d_N$ of the nanoneedle 100 in the lateral direction is in a range of 5 nm or more and 20 µm or less, and the length $L_N$ in the longitudinal direction is in a range of 10 nm or more and 50 µm or less. By manufacturing the nanoneedle 100 using a method for manufacturing the emitter according to the present invention described later, the nanoneedle 100 having the above-described range and made of a single crystal material having good quality without cracks, kinks, or the like can be easily provided.

Figure 2:
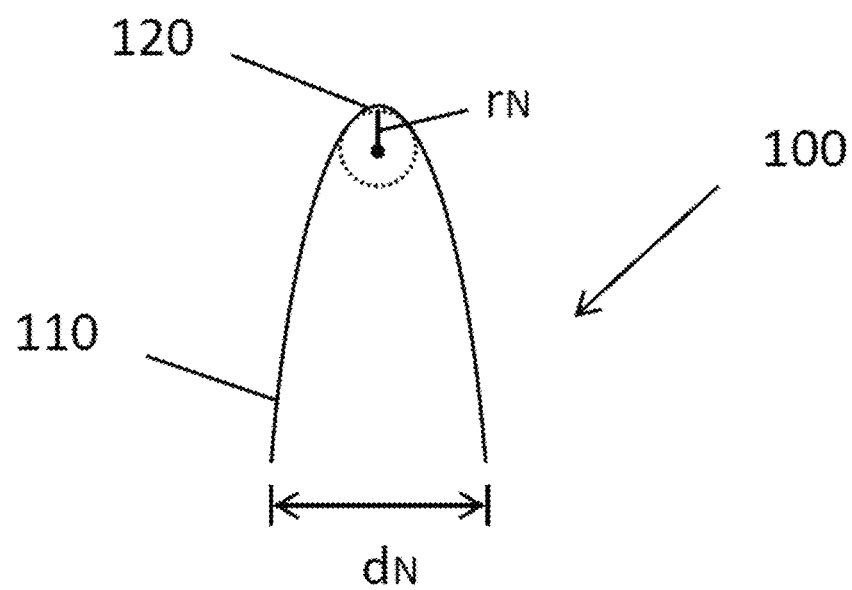
FIG. 2 is a partially enlarged view of the emitter shown in FIG. 1.

Preferably, in the end 120 of the nanoneedle 100, through which electrons are to be emitted, a radius of curvature $r_N$ of the tip of the end 120 is a value of 80% or less of the length $d_N$ of the nanoneedle 100 in the lateral direction (FIG. 2). In addition, as shown in examples described later, the above value can be set to 80% or less. For example, the radius of curvature $r_N$ of the tip of the end 120 may be 75% or less, 50% or less, 45% or less, 30% or less, 20% or less, 15% or less, 12.5% or less, 10% or less, 5% or less, 2.5% or less, 2% or less, 1% or less, or 0.5% or less of the length $d_N$ of the nanoneedle 100 in the lateral direction. By controlling the value of the radius of curvature $r_N$ of the tip of the end 120 in this manner, the emitter according to the present embodiment can emit electrons more efficiently, and can emit electrons more stably for a long time. Note that the radius of curvature $r_N$ of the tip of the end 120 of the nanoneedle 100, through which electrons are to be emitted, is calculated from the SEM image of the end 120. In addition, the tapered shape of the end 120 can be confirmed from the SEM image, the STEM image, the FIM image, and the FEM image of the end 120. Specifically, when the end 120 has a tapered shape, an SEM image or a STEM image as schematically shown in FIG. 2 can be obtained in plan view of the nanoneedle 100 from the longitudinal direction. In the FIM image, bright portions are concentrated on the tip of the end 120, and in the FEM image, the field electron emission pattern is observed as a single spot.

Note that the nanoneedle 100 is shown as the emitter itself in FIGS. 1 and 2, but the present embodiment is not limited thereto. For example, the emitter may be the nanoneedle 100 itself, or may have a configuration in which the nanoneedle 100 is attached to and integrated with a support needle, or a configuration in which such integrated component is further attached to a filament. In the case where the nanoneedle 100 is attached to and integrated with the support needle and such integrated component is further attached to the filament, an end face opposite to the end 120 of the nanoneedle 100 is preferably fixed to a support face of the support needle. In this way, structural stability of the entire emitter can be obtained, and electrons can be emitted more stably.

Furthermore, the surface layer portion of the nanoneedle 100 (single crystal material 110; this surface layer portion is, more specifically, for example, a surface layer portion of the end 120 through which electrons are to be emitted, and the like) may have an oxide layer (not shown) that can be inevitably formed by processing using a focused ion beam described later and/or exposure to a normal air atmosphere.

Next, a method for manufacturing the emitter according to the present embodiment will be described.

FIGS. 3(a), 3(b), and 3(c) are schematic views showing the method for manufacturing the emitter according to the present embodiment. FIG. 3(a) is a schematic view showing a state before processing using a focused ion beam, FIG. 3(b) is a schematic view showing a state after processing by irradiation with a focused ion beam under a first condition, and FIG. 3(c) is a schematic view showing a state after processing by irradiation with a focused ion beam under a second condition.

The method for manufacturing the emitter according to the present embodiment includes a step of processing the single crystal material in a vacuum using a focused ion beam to form an end of the single crystal material, through which electrons are to be emitted, into a tapered shape, the processing being performed in an environment in which a periphery of the single crystal material fixed to a support is opened.

More specifically, as shown in FIGS. 3(a) to 3(c), a single crystal material 310 is fixed to a support 320, and the single crystal material 310 is processed in a vacuum using a focused ion beam to form an end 330 of the single crystal material 310, through which electrons are to be emitted into a tapered shape, the processing being performed in an environment in which the periphery of the single crystal material 310 excluding the fixed portion is opened. In the method for manufacturing the emitter according to the present embodiment, an end face 340 opposite to the end 330 of the single crystal material 310, through which electrons are to be emitted, is preferably fixed to a support face 350 of the support 320. In this way, structural stability of the entire emitter can be obtained, and electrons can be emitted more stably.

The single crystal material 310 is preferably chemically untreated. In the present description, the state in which the single crystal material is "chemically untreated" means that the single crystal material is not subjected to chemical treatment for the purpose of processing shape thereof (particularly, the shape of the tip thereof). More specifically, it means that the single crystal material 310 is not subjected to chemical treatment such as etching, both before and after being fixed to the support 320. The chemically untreated single crystal material 310 suppresses surface contamination of the single crystal material due to conventional electrochemical etching or the like and/or change in stoichiometric composition of the single crystal material. Therefore, an emitter that more effectively exhibits the electron emission characteristics inherent in the single crystal material can be obtained.

In the present description, "an environment in which a(the) periphery of the single crystal material (310) is opened" means that the periphery of the single crystal material can be irradiated with an ion beam irradiated from a focused ion beam device. More specifically, it means that the periphery of the single crystal material 310 fixed to the support 320 (excluding the portion fixed to the support 320) can be irradiated with the ion beam irradiated from the focused ion beam device. In other words, it is intended that a shield blocking the irradiation of the ion beam is not disposed around the single crystal material 310 fixed to the support 320 (excluding the portion fixed to the support 320). The end 330 of the single crystal material 310, through which electrons are to be emitted, can be easily formed into a tapered shape by processing the single crystal material 310 in a vacuum using the focused ion beam in an environment in which the periphery of the single crystal material 310 is opened. Furthermore, in an environment in which the periphery of the single crystal material 310 is opened, a radius of curvature $r_N$ of the tip of the end 330 can be accurately controlled on the order of nanometers (for example, in a range of 1 nm to 1000 nm) by appropriately setting the processing condition with the focused ion beam.

As a processing method using a focused ion beam, a conventionally and publicly known method can be used. In addition, the processing condition can be set and adjusted, if needed, in accordance with the kind, size, and shape of the single crystal material to be processed, the size, shape, and application of the emitter to be aimed, desired emitter characteristics, and the like.

For example, when the current value and the voltage value, among the irradiation conditions of an ion beam of a focused ion beam (FIB) system, are reduced, the milling rate (processing speed) becomes less fast, and the time required to obtain an emitter having a desired shape becomes long. Contrarily, it becomes easy to control the radius of curvature $r_N$ of the tip of the end of the single crystal material, through which electrons are to be emitted. Further, it is also effective to adjust the current value and/or the voltage value in accordance with the kind of the single crystal material to be processed (for example, an $LaB_6$ single crystal used in examples described later), or to set the milling rate in accordance with the size (width×depth×height) and the shape of the single crystal material before processing (single crystal piece).

For the sake of clarity, FIG. 3(a) shows an aspect in which the single crystal material 310 has a rectangular shape, and the length in the longitudinal direction (up-and-down direction in the document) is greater than the length in the lateral direction (left-and-right direction in the document), and FIGS. 3(b) and 3(c) show an aspect in which the tip of the single crystal material 310 is sharpen by processing using a focused ion beam, and the lengths in the lateral direction and the longitudinal direction are equal to or shorter than the respective lengths before processing. However, it should be noted that the aspects of the single crystal material 310 before and after processing are not limited thereto. For example, the length of the single crystal material 310 in the longitudinal direction before processing may be about the same as or smaller than the length thereof in the lateral direction. Further, by adjusting the processing conditions using a focused ion beam, the single crystal material 310 can also be formed into a needle shape in which the tip of the single crystal material 310 is sharpened, without substantially changing the length of the single crystal material 310 in the lateral direction before processing.

The support 320 may be used only for processing the single crystal material 310, or may also have the function of the above-described support needle (a support needle 430 shown in FIG. 4 described later). Examples of the material having both the function of the support for processing such a single crystal material and the function of the support needle include tungsten (W), tantalum (Ta), and platinum (Pt) used in examples described later.

In the present embodiment, a single processing condition or a combination of a plurality of processing conditions may be set in the above processing step.

An aspect using two conditions will be described with reference to FIGS. 3(b) and 3(c).

For example, the processing step includes thinning the single crystal material toward the end through which electrons are to be emitted (FIG. 3(b)), and an appropriate processing condition (first condition) can be set and adjusted therefor. As the above first condition, irradiation conditions of an ion beam of the focused ion beam (FIB) system are, for example, as follows: Current: 5 to 5000 pA, voltage: 1 to 100 kV, irradiation position: scanning in the direction from the outer side to the inner side of the single crystal material, and irradiation time: 0.1 to 100 minutes. The irradiation conditions of the ion beam of the focused ion beam (FIB) system are preferably as follows: Current: 200 to 800 pA, voltage: 20 to 40 kV, irradiation position: scanning in the direction from the outer side to the inner side of the single crystal material, and irradiation time: 0.5 to 30 minutes.

In addition, the processing step includes setting the radius of curvature $r_N$ of the tip of the end to a value of 80% or less of the length $d_N$ of the single crystal material in the lateral direction (FIG. 3(c)), and an appropriate processing condition (second condition) can be set and adjusted therefor. As the above second condition, irradiation conditions of an ion beam of the focused ion beam (FIB) system are, for example, as follows: Current: 1 to 1000 pA, voltage: 1 to 100 kV, irradiation position: scanning in the direction from the outer side to the inner side of the single crystal material, and irradiation time: 0.1 to 100 minutes. The irradiation conditions of the ion beam of the focused ion beam (FIB) system are preferably as follows: Current: 10 to 100 pA, voltage: 2 to 10 kV, irradiation position: scanning in the direction from the outer side to the inner side of the single crystal material, and irradiation time: 0.5 to 10 minutes.

In the processing under the above first condition, the single crystal material 310 can be changed from a rectangular shape as shown in FIG. 3(a) to a substantially conical shape as shown in FIG. 3(b). In other words, in the processing under the first condition, the single crystal material 310 is irradiated with the focused ion beam in a direction from the outer side to the inner side of the single crystal material 310 at a predetermined current value and voltage value for a predetermined time, whereby the single crystal material 310 can be thinned toward the end 330 through which electrons are to be emitted, and the end 330 of the single crystal material 310 can be formed into a tapered shape.

In the processing under the above second condition, the single crystal material 310 can be changed from a substantially conical shape as shown in FIG. 3(b) to a substantially conical shape having a sharper form as shown in FIG. 3(c). In other words, in the processing under the second condition, the single crystal material 310 is irradiated with the focused ion beam in a direction from the outer side to the inner side of the single crystal material 310 at a predetermined current value and voltage value for a predetermined time, whereby the radius of curvature $r_N$ of the tip of the end 330 of the single crystal material 310 having a tapered shape can be set to a value of 80% or less of a length $d_N$ of the single crystal material 310 in the lateral direction.

In the present aspect, the current value and the voltage value under the second condition may be the same as the current value and the voltage value under the first condition, but are preferably smaller than the current value and the voltage value under the first condition. This makes it possible to control the radius of curvature $r_N$ of the tip of the end 330 more accurately to be a desired value. In other words, the current value and the voltage value under the first condition may be the same as the current value and the voltage value under the second condition, but are preferably greater than the current value and the voltage value under the second condition. In this way, in accordance with the shape of the single crystal material 310 before processing using the focused ion beam, the single crystal material 310 can be thinned toward the end 330 in a shorter time, and the end 330 of the single crystal material 310 can be formed into a tapered shape.

In addition, the processing step may further include adjusting the shape of the end (so-called finish processing; not shown), and an appropriate processing condition can be set and adjusted therefor. As the processing condition for the above finish processing, irradiation conditions of an ion beam of the focused ion beam (FIB) system are, for example, as follows: Current: 1 to 1000 pA, voltage: 1 to 100 kV, and irradiation time: 0.1 to 100 minutes. The irradiation conditions of the ion beam of the focused ion beam (FIB) system are preferably as follows: Current: 10 to 100 pA, voltage: 1 to 10 kV, irradiation position: scanning in the direction from the outer side to the inner side of the single crystal material, and irradiation time: 0.1 to 5 minutes.

Embodiment 2

In Embodiment 2, an electron gun including the nanoneedle emitter according to the present invention will be described.

Figure 4:
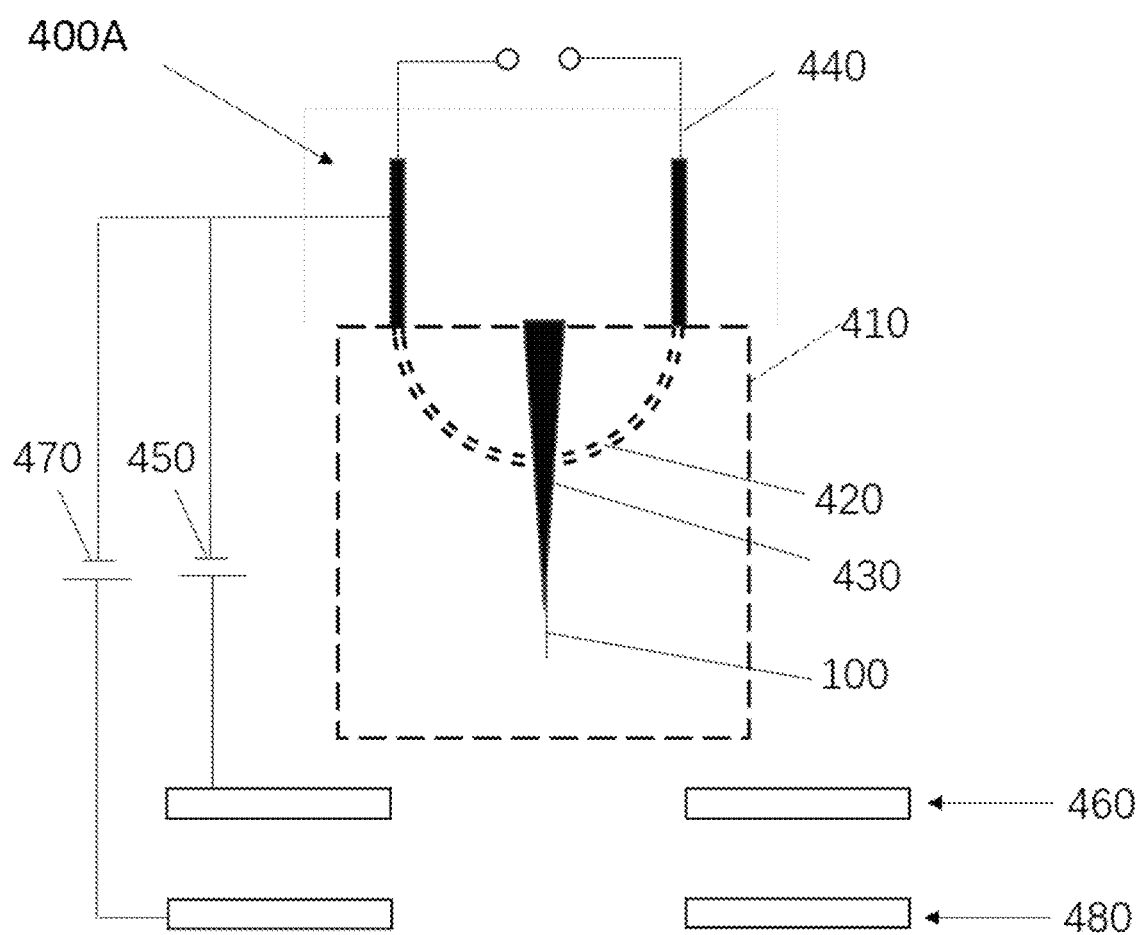
FIG. 4 is a schematic view showing an electron gun according to Embodiment 2.

FIG. 4 is a schematic view showing the electron gun according to the present embodiment.

An electron gun 400A according to the present embodiment includes at least an emitter 410 including the nanoneedle 100 described in Embodiment 1. In FIG. 4, the emitter 410 further includes a filament 420 and a support needle 430 in addition to the nanoneedle 100.

The nanoneedle 100 is attached to the filament 420 via the support needle 430. The support needle 430 is made of an element selected from the group consisting of tungsten (W), tantalum (Ta), platinum (Pt), rhenium (Re), and carbon (C). This is preferable because handling of the nanoneedle 100 is simplified. In addition, the nanoneedle 100 is attached to the support needle 430 with a conductive adhesive sheet such as a carbon pad. Alternatively, in a case where the support needle 430 is also a support 320 for processing a single crystal material 310 shown in FIGS. 3(a) and 3(b), the nanoneedle 100 is attached to the support needle 430 in a manner similar to that of the case where the single crystal material 310 is fixed to the support 320. In FIG. 4, the filament 420 has a hairpin-type shape (U-shape), but is not limited thereto, and the shape of the filament 420 may be any shape such as a V-shape.

In the electron gun 400A, an extraction power supply 450 is connected between an electrode 440 and an extraction electrode 460, and the extraction power supply 450 applies a voltage between the emitter 410 and the extraction electrode 460. In the electron gun 400A, an acceleration power supply 470 is further connected between the electrode 440 and an acceleration electrode 480, and the acceleration power supply 470 applies a voltage between the emitter 410 and the acceleration electrode 480.

The electrode 440 may further be connected to a flash power supply in a case where the electron gun 400A is a cold cathode field emission electron gun, or may be connected to a heating power supply in a case where the electron gun 400A is a Schottky electron gun.

The electron gun 400A may be disposed under a vacuum of $10^{-8}$ Pa to $10^{-7}$ Pa (in the range of $10^{-8}$ Pa or more and $10^{-7}$ Pa or less), and in this case, an end of the emitter 410, through which electrons are to be emitted, can be kept clean.

An operation in a case where the electron gun 400A according to the present embodiment is a cold cathode field emission electron gun will be briefly described.

The extraction power supply 450 applies a voltage between the emitter 410 and the extraction electrode 460. In this way, electric field concentration is generated at the end of the nanoneedle 100 of the emitter 410, through which electrons are to be emitted, and electrons are extracted. Further, the acceleration power supply 470 applies a voltage between the emitter 410 and the acceleration electrode 480. In this way, the electrons extracted at the end of the nanoneedle 100 of the emitter 410, through which the electrons are to be emitted, are accelerated and emitted toward a sample. The surface of the nanoneedle 100 may be cleaned by, if needed, performing flushing using a flash power supply connected to the electrode 440. These operations are performed under the above-described vacuum.

An operation in a case where the electron gun 400A according to the present embodiment is a Schottky electron gun will be briefly described.

A heating power supply connected to the electrode 440 heats the emitter 410, and the extraction power supply 450 applies a voltage between the emitter 410 and the extraction electrode 460. In this way, Schottky emission is generated at the end of the nanoneedle 100 of the emitter 410, through which the electrons are to be emitted, and electrons are extracted. Further, the acceleration power supply 470 applies a voltage between the emitter 410 and the acceleration electrode 480. In this way, the electrons extracted at the end of the nanoneedle 100 of the emitter 410, through which the electrons are to be emitted, are accelerated and emitted toward the sample. These operations are performed under the above-described vacuum. Since thermoelectrons can be emitted from the nanoneedle 100 of the emitter 410 by the heating power supply, the electron gun 400A may further include a suppressor (not shown) for shielding the thermoelectrons.

Since the electron gun 400A according to the present embodiment includes the emitter 410 including the nanoneedle 100 described in Embodiment 1, electrons can be easily emitted, and electrons can be stably emitted for a long time. Such electron gun 400A is employed in any electronic device having an electron focusing capability. Such an electronic device is, for example, selected from the group consisting of a scanning electron microscope, a transmission electron microscope, a scanning transmission electron microscope, an electron diffractometer, an Auger electron spectrometer, an electron energy loss spectrometer, and an energy dispersive electron spectrometer.

<Nanowire Emitter, Electron Gun using the Same, Electronic Device using the Same, and Method for Manufacturing the Same>

Embodiment 3

In Embodiment 3, a nanowire emitter according to the present invention and a method for manufacturing the same will be described.

Figure 5:
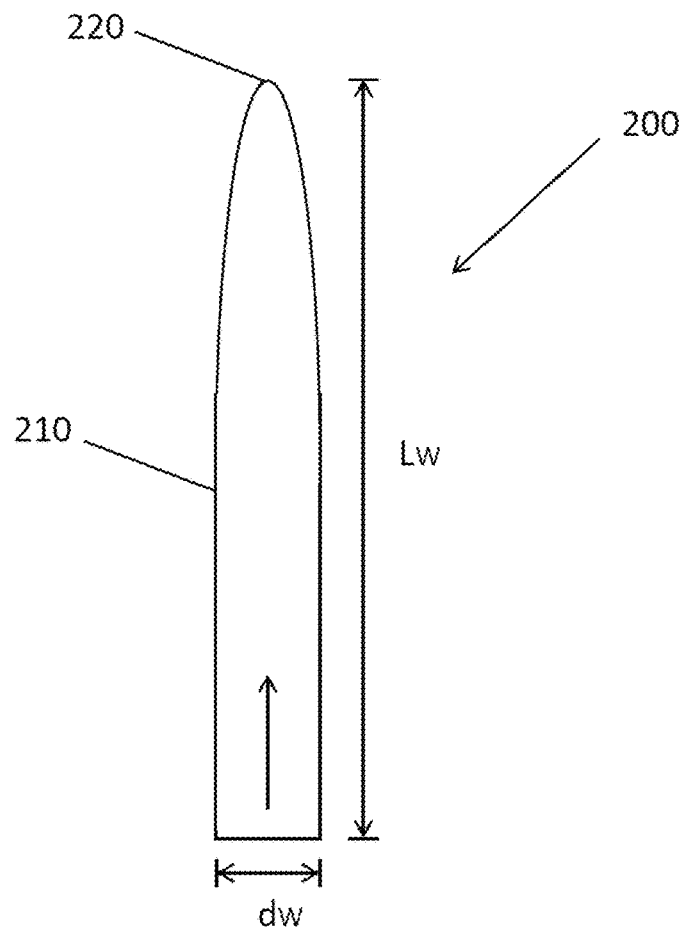
FIG. 5 is a schematic view of an emitter according to Embodiment 3.

FIG. 5 is a schematic view of an emitter according to Embodiment 3.

As shown in FIG. 5, the emitter according to the present embodiment includes a nanowire 200, and the nanowire 200 is made of a single crystal material 210. That is, in the present embodiment, the nanowire 200 is a single crystal nanowire. In addition, the nanowire 200 (single crystal material 210) has a tapered shape toward an end 220 through which electrons are to be emitted.

In the present description, the nanowire is intended to have a wire shape on the order of nanometers. In the present embodiment, the section of the nanowire 200 is not particularly limited, and may be, for example, circular, elliptical, rectangular, or polygonal, or may have an irregular shape. In addition, the external appearance shape of the nanowire 200 is not particularly limited, and may be, for example, conical, cylindrical, or polyhedral, or may have an irregular shape.

The single crystal material 210 is not particularly limited as long as it is a metal single crystal or a compound single crystal and can be used as a material of an electron gun. Specific examples thereof include rare-earth hexaborides ($LaB_6$, $GdB_6$, $CeB_6$, and the like) and rare-earth borides such as $GdB_{66}$, $TbB_{66}$, $GdB_{44}Si_2$, metal carbides (ZrC, HfC, NbC, TiC, TaC, VC, and the like), metal oxides (ZnO, CuO, $WO_3$, and the like), high-melting-point metals (W, Mo, Ta, and the like), graphite, and Si contented compounds.

In the emitter according to the present embodiment, the work function of the end 220 of the nanowire 200 (i.e., the single crystal material 210), through which electrons are to be emitted, is low, and electrons can be easily emitted. As a result, in the emitter according to the present embodiment, a field electron emission pattern at the end 220 obtained by a field emission microscope (FEM) is a single spot, and the emitter is excellent in electron emission characteristics.

The excellent electron emission characteristics of the emitter according to the present embodiment are provided by a manufacturing method described later. An example of the structural features of the emitter according to the present embodiment is that an oxide layer is provided in a surface layer portion of the nanowire 200 (single crystal material 210; this surface layer portion is, more specifically, a surface layer portion of the end 220 through which electrons are to be emitted). The specific mechanism in which the oxide layer is formed at the surface layer portion of the nanowire 200 by the method for manufacturing the emitter according to the present invention is not necessarily clear. However, it is considered that the single crystal material 210 is irradiated with the ion beam in the process of the processing step using the focused ion beam, whereby the oxide layer is formed at the surface layer portion of the end 220 through which electrons are to be emitted, or the like. For example, in a case where the single crystal material 210 is HfC, the above oxide layer may be $HfO_2$ (hafnium carbide). The presence of such an oxide layer can be confirmed by, for example, analyzing the element distribution of a portion including the end 220 of the nanowire 200, through which electrons are to be emitted, using STEM-EDS mapping, 3D atom probe (3DAP), or the like. Note that there is a case where an oxide layer is inevitably formed at the surface layer portion of the nanowire 200 by exposing the nanowire 200 to a normal air atmosphere, but such an inevitable oxide layer and the oxide layer arising from the irradiation of the ion beam described above can be distinguished by using an analysis means such as STEM-EDS mapping.

The longitudinal direction (the direction indicated by the upward arrow in FIG. 5) of the nanowire 200 preferably corresponds to a specific crystal direction of the crystal structure of the single crystal material 210. In this way, a favorable single crystal with few cracks, kinks, and the like can be secured as the single crystal material 210 in the nanowire 200. In addition, since the crystal plane of the end 220 through which electrons are to be emitted includes a plane having a low work function, electrons can be efficiently emitted. For example, in a case where the single crystal material 210 is HfC, the end 220 through which electrons are to be emitted preferably includes a plain having a low work function, such as a <111> plane or a <110> plane. The crystal direction of the single crystal material 210, to which the longitudinal direction of the nanowire 200 corresponds, may be selected from the viewpoint of ease of manufacturing and processing, quality of a crystal, and the like.

Preferably, a length $d_W$ of the nanowire 200 in the lateral direction (i.e., the diameter of the nanowire 200) is in the range of 1 nm or more and 150 nm or less, and a length $L_W$ in the longitudinal direction is in the range of 500 nm or more and 30 μm or less. With such a size, electric field concentration on the end 220 through which electrons are to be emitted can be effectively generated, thereby allowing the end 220 to emit more electrons. Note that, in a case where the section of the nanowire 200 is not circular, for example, in a case where the section of the nanowire 200 is rectangular, the length $d_W$ in the lateral direction refers to the length of the shorter side of the rectangle. Alternatively, in a case where the section of the nanowire 200 is polygonal, the diameter of the circle inscribed by the polygon (or the minor axis of the ellipse) may be set as the length $d_W$ in the lateral direction.

More preferably, the length $d_W$ of the nanowire 200 in the lateral direction is in a range of 10 nm or more and 100 nm or less, and the length $L_W$ in the longitudinal direction is in a range of 5 μm or more and 30 μm or less. By manufacturing the nanowire 200 using a method for manufacturing the emitter according to the present invention described later, the nanowire 200 having the above-described range and made of a single crystal material having good quality without cracks, kinks, or the like can be easily provided.

Figure 6:
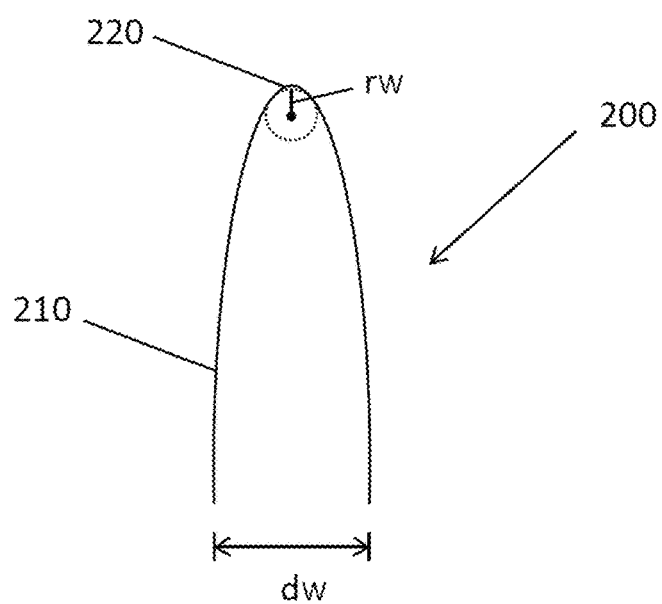
FIG. 6 is a partially enlarged view of the emitter shown in FIG. 5.

Preferably, the end 220 of the nanowire 200, through which electrons are to be emitted, has a tapered shape, and a radius of curvature $r_W$ of the tip of the end 220 is a value of 50% or less of the length $d_W$ of the nanowire 200 in the lateral direction (FIG. 6). In addition, as shown in examples described later, the above value can be set to 50% or less. For example, the radius of curvature $r_W$ of the tip of the end 220 may be 45% or less, 35% or less, 30% or less, 20% or less, 25% or less, 20% or less, 15% or less, 10% or less, 5% or less, 2.5% or less, or 1% or less of the length $d_W$ of the nanowire 200 in the lateral direction. By controlling the value of the radius of curvature $r_W$ of the tip of the end 220 in this manner, the emitter according to the present embodiment can emit electrons more efficiently, and can emit electrons more stably for a long time. Note that the radius of curvature $r_W$ of the tip of the end 220 of the nanowire 200, through which electrons are to be emitted, is calculated from the SEM image of the end 220. In addition, the tapered shape of the end 220 can be confirmed from the SEM image, the STEM image, the FIM image, and the FEM image of the end 220. Specifically, when the end 220 has a tapered shape, an SEM image or a STEM image as schematically shown in FIG. 6 can be obtained in plan view of the nanowire 200 from the longitudinal direction. In the FIM image, bright portions are concentrated on the tip of the end 220, and in the FEM image, the field electron emission pattern is observed as a single spot.

Note that the nanowire 200 is shown as the emitter itself in FIGS. 5 and 6, but the present embodiment is not limited thereto. For example, the emitter may be the nanowire 200 itself, or may have a configuration in which the nanowire 200 is attached to and integrated with a support needle, or a configuration in which such integrated component is further attached to a filament.

Next, a method for manufacturing the emitter according to the present embodiment will be described.

FIGS. 7(a) and 7(b) are schematic views showing the method for manufacturing the emitter according to the present embodiment. FIG. 7(a) is a schematic view showing a state before processing using the focused ion beam, and FIG. 7(b) is a schematic view showing a state after processing using the focused ion beam.

In FIGS. 7(a) and 7(b), the same reference numerals are given to the same configurations as those in the method for manufacturing the emitter according to Embodiment 1 shown in FIG. 3.

The method for manufacturing the emitter according to the present embodiment includes a step of processing the single crystal material in a vacuum using a focused ion beam to form an end of the single crystal material, through which electrons are to be emitted, into a tapered shape, the processing being performed in an environment in which a periphery of the single crystal material fixed to a support is opened.

More specifically, as shown in FIGS. 7(a) and 7(b), the single crystal nanowire 310 is fixed to the metal support 320, and the single crystal nanowire 310 is processed in a vacuum using the focused ion beam to form an end 330 of the single crystal nanowire 310, through which electrons are to be emitted into a tapered shape, the processing being performed in an environment in which the periphery of the single crystal nanowire 310 excluding the fixed portion is opened. In the method for manufacturing the emitter according to the present embodiment, an end 360 opposite to the end 330 of the single crystal nanowire 310, through which electrons are to be emitted, is fixed to the end of the metal support 320.

In the present description, "an environment in which a(the) periphery of the single crystal nanowire (310) is opened" means that the periphery of the single crystal material can be irradiated with an ion beam irradiated from a focused ion beam device. More specifically, it means that the periphery of the single crystal nanowire 310 fixed to the metal support 320 (excluding the portion fixed to the metal support 320) can be irradiated with the ion beam irradiated from the focused ion beam device. In other words, it is intended that a shield blocking the irradiation of the ion beam is not disposed around the single crystal nanowire 310 fixed to the metal support 320 (excluding the portion fixed to the metal support 320). The end 330 of the single crystal nanowire 310, through which electrons are to be emitted, can be easily formed into a tapered shape by processing the single crystal nanowire 310 in a vacuum using the focused ion beam in an environment in which the periphery of the single crystal nanowire 310 is opened. Furthermore, in an environment in which the periphery of the single crystal nanowire 310 is opened, a radius of curvature $r_W$ of the tip of the end 330 can be accurately controlled on the order of nanometers (for example, in a range of 1 nm to 1000 nm) by appropriately setting the processing condition with the focused ion beam.

As a processing method using a focused ion beam, a conventionally and publicly known method can be used. In addition, the processing condition can be set and adjusted, if needed, in accordance with the kind, size, and shape of the single crystal nanowire to be processed, the size, shape, and application of the emitter to be aimed, desired emitter characteristics, and the like.

For example, when the current value and the voltage value, among the irradiation conditions of an ion beam of a focused ion beam (FIB) system, are reduced, the milling rate (processing speed) becomes less fast, and the time required to obtain an emitter having a desired shape becomes long. Contrarily, it becomes easy to control the radius of curvature $r_W$ of the tip of the end of the single crystal nanowire, through which electrons are to be emitted. Further, it is also effective to adjust the current value and/or the voltage value in accordance with the kind of the single crystal nanowire to be processed (for example, a nanowire made of an HfC single crystal, and a nanowire made of a $GdB_{44}Si_2$ single crystal used in examples described later), or to set the milling rate in accordance with the length $L_W$ in the longitudinal direction and the sectional shape of the single crystal nanowire before processing (single crystal piece).

For the sake of clarity, FIG. 7(a) shows an aspect in which the single crystal nanowire 310 has a rectangular shape, and the length in the longitudinal direction (up-and-down direction in the document) is greater than the length in the lateral direction (left-and-right direction in the document), and FIG. 7(b) shows an aspect in which the tip of the single crystal nanowire 310 is sharpen by processing using a focused ion beam, and the lengths in the lateral direction and the longitudinal direction are equal to the respective lengths before processing. However, it should be noted that the aspects of the single crystal nanowire 310 before and after processing are not limited thereto. For example, the length of the single crystal nanowire 310 in the longitudinal direction before processing may be about the same as or smaller than the length thereof in the lateral direction. Further, by adjusting the processing conditions using a focused ion beam, the single crystal nanowire 310 can also be formed into a tapered shape in which the tip of the single crystal nanowire 310 is sharpened, without substantially changing the length of the single crystal nanowire 310 in the lateral direction before processing, and the length in the longitudinal direction can be shortened than the respective length before processing.

The metal support 320 may be used only for processing the single crystal nanowire 310, or may also have the function of the above-described support needle (a support needle 430 shown in FIG. 8 described later). Examples of the material having both the function of the support for processing such a single crystal nanowire and the function of the support needle include tungsten (W), tantalum (Ta), and platinum (Pt) used in examples described later.

In the present embodiment, a single processing condition or a combination of a plurality of processing conditions may be set in the above processing step.

For example, the processing step includes thinning the single crystal nanowire toward the end through which electrons are to be emitted, and an appropriate processing condition can be set and adjusted therefor. As the above processing condition, irradiation conditions of an ion beam of the focused ion beam (FIB) system are, for example, as follows: Current: 1 to 1000 pA, voltage: 1 to 100 kV, irradiation position: scanning in the direction from the outer side to the inner side of the single crystal nanowire, and irradiation time: 0.1 to 100 minutes. The irradiation conditions of the ion beam of the focused ion beam (FIB) system are preferably as follows: Current: 20 to 100 pA, voltage: 2 to 10 kV, irradiation position: scanning in the direction from the outer side to the inner side of the single crystal nanowire, and irradiation time: 0.5 to 5 minutes.

In addition, the processing step includes setting a radius of curvature $r_W$ of the tip of the end to a value of 50% or less of a length $d_W$ of the single crystal nanowire in the lateral direction, and an appropriate processing condition can be set and adjusted therefor. This processing condition may be the same as or different from the above-described processing condition for thinning the single crystal nanowire toward the end through which electrons are to be emitted.

FIG. 7(b) shows a state after thinning the single crystal nanowire 310 toward the end 330 through which electrons are to be emitted and setting the radius of curvature $r_W$ of the tip of the end 330 to a value of 50% or less of the length $d_W$ of the single crystal nanowire 310 in the lateral direction, using the same processing condition (i.e., a single processing condition). When the single processing condition is used in this manner, the end 330 of the single crystal nanowire 310 can be efficiently formed into a tapered shape, and the radius of curvature $r_W$ of the tip of the end 330 can be controlled to be a desired value. On the other hand, it is also effective to combine a plurality of processing conditions in accordance with the shape and the like of the single crystal nanowire before processing using the focused ion beam. For example, in a case where the length $d_W$ of the single crystal nanowire in the lateral direction and a length $L_W$ of the single crystal nanowire in the longitudinal direction before processing are relatively large, processing conditions may be combined as follows. As the first processing condition, a relatively large current value and a relatively large voltage value may be selected from the above ranges, and the single crystal nanowire 310 may be irradiated with the focused ion beam in a direction from the outer side to the inner side of the single crystal nanowire 310 for a predetermined time to be thinned toward the end 330. Thereafter, as the second processing condition, a relatively small current value and a relatively small voltage value may be selected from the above ranges, and the single crystal nanowire 310 may be irradiated with the focused ion beam in a direction from the outer side to the inner side of the single crystal nanowire 310 for a predetermined time to set the radius of curvature $r_W$ of the tip of the end 330 to a value of 50% or less of the length $d_W$ of the single crystal nanowire 310 in the lateral direction.

In addition, the processing step may further include adjusting the shape of the end (so-called finish processing; not shown), and an appropriate processing condition can be set and adjusted therefor. The irradiation conditions of an ion beam of the focused ion beam (FIB) system are, for example, as follows: Current: 1 to 1000 pA, voltage: 1 to 100 kV, and irradiation time: 0.1 to 100 minutes. The irradiation conditions of the ion beam of the focused ion beam (FIB) system are preferably as follows: Current: 10 to 100 pA, voltage: 1 to 10 kV, and irradiation time: 0.1 to 3 minutes.

Embodiment 4

In Embodiment 4, an electron gun including the nanowire emitter according to the present invention will be described.

Figure 8:
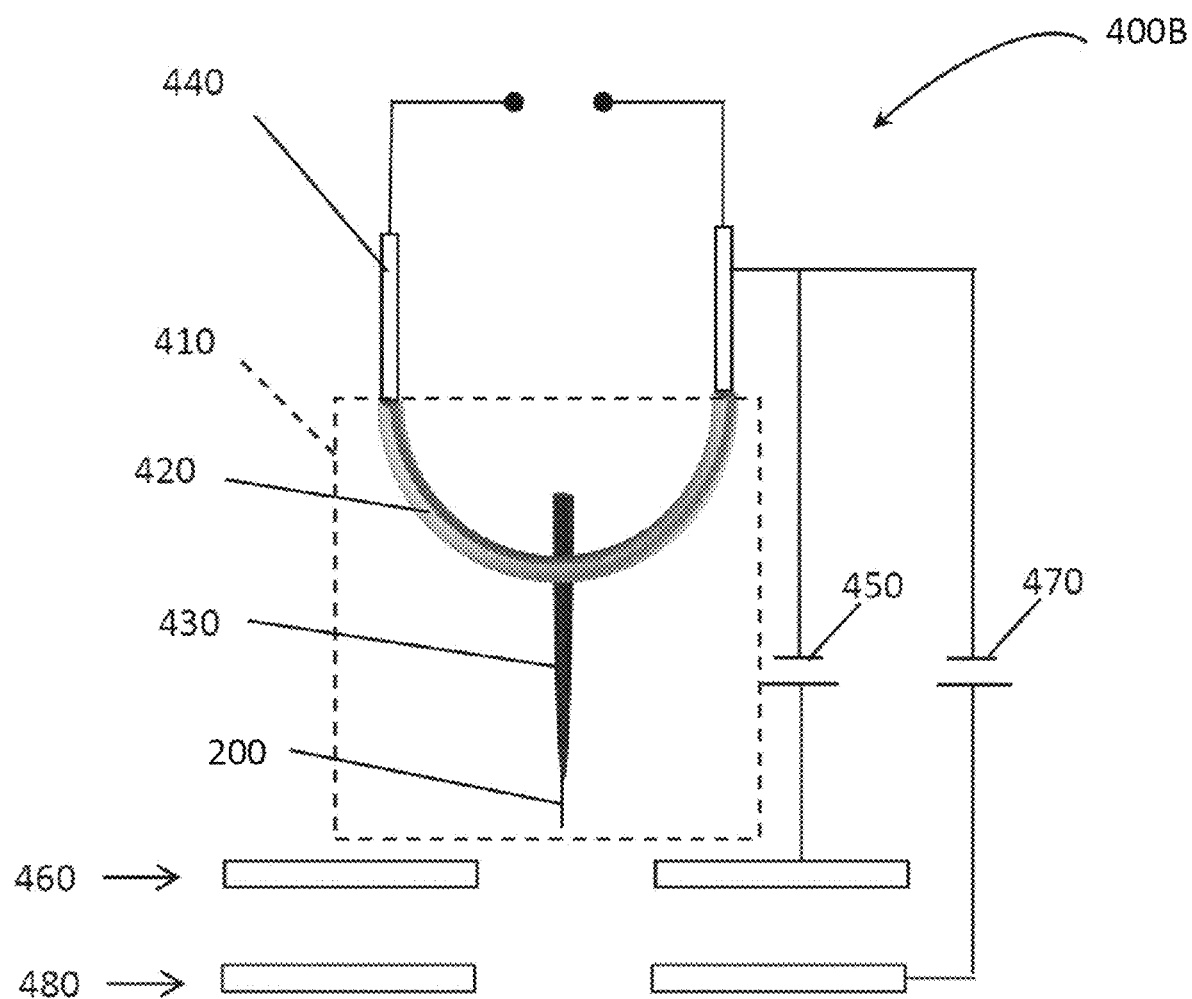
FIG. 8 is a schematic view showing an electron gun according to Embodiment.

FIG. 8 is a schematic view showing the electron gun according to the present embodiment.

In FIG. 8, the same reference numerals are given to the same configurations as those in the electron gun according to Embodiment 2 shown in FIG. 4.

An electron gun 400B according to the present embodiment includes at least an emitter 410 including the nanowire 200 described in Embodiment 3. In FIG. 8, the emitter 410 further includes a filament 420 and a support needle 430 in addition to the nanowire 200.

The nanowire 200 is attached to the filament 420 via the support needle 430. The support needle 430 is made of an element selected from the group consisting of tungsten (W), tantalum (Ta), platinum (Pt), rhenium (Re), and carbon (C). This is preferable because handling of the nanowire 200 is simplified. In addition, the nanowire 200 is attached to the support needle 430 with a conductive adhesive sheet such as a carbon pad. Alternatively, in a case where the support needle 430 is also a metal support 320 for processing a single crystal nanowire 310 shown in FIGS. 7(a) and 7(b), the nanowire 200 is attached to the support needle 430 in a manner similar to that of the case where the single crystal nanowire 310 is fixed to the metal support 320. In FIG. 8, the filament 420 has a hairpin-type shape (U-shape), but is not limited thereto, and the shape of the filament 420 may be any shape such as a V-shape.

In the electron gun 400B, an extraction power supply 450 is connected between an electrode 440 and an extraction electrode 460, and the extraction power supply 450 applies a voltage between the emitter 410 and the extraction electrode 460. In the electron gun 400B, an acceleration power supply 470 is further connected between the electrode 440 and an acceleration electrode 480, and the acceleration power supply 470 applies a voltage between the emitter 410 and the acceleration electrode 480.

The electrode 440 may further be connected to a flash power supply in a case where the electron gun 400B is a cold cathode field emission electron gun, or may be connected to a heating power supply in a case where the electron gun 400B is a Schottky electron gun.

The electron gun 400B may be disposed under a vacuum of $10^{-8}$ Pa to $10^{-7}$ Pa (in the range of $10^{-8}$ Pa or more and $10^{-7}$ Pa or less), and in this case, an end of the emitter 410, through which electrons are to be emitted, can be kept clean.

An operation in a case where the electron gun 400B according to the present embodiment is a cold cathode field emission electron gun will be briefly described.

The extraction power supply 450 applies a voltage between the emitter 410 and the extraction electrode 460. In this way, electric field concentration is generated at the end of the nanowire 200 of the emitter 410, through which electrons are to be emitted, and electrons are extracted. Further, the acceleration power supply 470 applies a voltage between the emitter 410 and the acceleration electrode 480. In this way, the electrons extracted at the end of the nanowire 200 of the emitter 410, through which the electrons are to be emitted, are accelerated and emitted toward a sample. The surface of the nanowire 200 may be cleaned by, if needed, performing flushing using a flash power supply connected to the electrode 440. These operations are performed under the above-described vacuum.

An operation in a case where the electron gun 400B according to the present embodiment is a Schottky electron gun will be briefly described.

A heating power supply connected to the electrode 440 heats the emitter 410, and the extraction power supply 450 applies a voltage between the emitter 410 and the extraction electrode 460. In this way, Schottky emission is generated at the end of the nanowire 200 of the emitter 410, through which the electrons are to be emitted, and electrons are extracted. Further, the acceleration power supply 470 applies a voltage between the emitter 410 and the acceleration electrode 480. In this way, the electrons extracted at the end of the nanowire 200 of the emitter 410, through which the electrons are to be emitted, are accelerated and emitted toward the sample. These operations are performed under the above-described vacuum. Since thermoelectrons can be emitted from the nanowire 200 of the emitter 410 by the heating power supply, the electron gun 400B may further include a suppressor (not shown) for shielding the thermoelectrons.

Since the electron gun 400B according to the present embodiment includes the emitter 410 including the nanowire 200 described in Embodiment 3, electrons can be easily emitted, and electrons can be stably emitted for a long time. Such electron gun 400B is employed in any electronic device having an electron focusing capability. Such an electronic device is, for example, selected from the group consisting of a scanning electron microscope, a transmission electron microscope, a scanning transmission electron microscope, an electron diffractometer, an Auger electron spectrometer, an electron energy loss spectrometer, and an energy dispersive electron spectrometer.

Next, the present invention will be described in detail with reference to specific examples, but it should be noted that the present invention is not limited to these examples.

EXAMPLES

Example 1

In the present example, a nanoneedle made of an $LaB_6$ single crystal was prepared and an emitter was manufactured.

A focused ion beam (FIB) system was used to prepare the following nanoneedle.

Platinum (Pt) was deposited on the surface in a certain range (about 15 μm×about 3 μm) of the $LaB_6$ bulk single crystal, and then the periphery and the bottom thereof were shaven and cut, and an $LaB_6$ single crystal piece was cut out. A tungsten chip was brought into contact with the surface of the cut-out $LaB_6$ single crystal piece, and platinum (Pt) was deposited at the contact point to fix the $LaB_6$ single crystal and the tungsten chip, and then the $LaB_6$ single crystal piece was picked up using the tungsten chip and placed on a support made of metal (a tungsten needle having a tip with a flat shape). Thereafter, the $LaB_6$ single crystal piece was fixed on the support by deposition of platinum (Pt), and the $LaB_6$ single crystal piece was cut at an appropriate position.

In this way, the end face of the $LaB_6$ single crystal piece (width: about 1 μm×depth: about 1 μm×height: about 2.1 μm) was fixed to the support face of the tungsten needle.

Subsequently, in the order of the following (1) and (2), the $LaB_6$ single crystal piece on the tungsten needle was processed by irradiation with an ion beam under two conditions, and a nanoneedle made of the $LaB_6$ single crystal was prepared.

Irradiation condition of ion beam:

(1) Current: 260 pA, voltage: 30 kV, irradiation position: scanning in the direction from the outer side to the inner side of the single crystal piece, and irradiation time: 3 minutes.

(2) Current: 41 pA, voltage: 5 kV, irradiation position: scanning in the direction from the outer side to the inner side of the single crystal piece, and irradiation time: 1 minute.

In the processing of the $LaB_6$ single crystal piece, the periphery of the $LaB_6$ single crystal piece excluding the portion fixed to the tungsten needle was set to an open environment.

Figure 9:
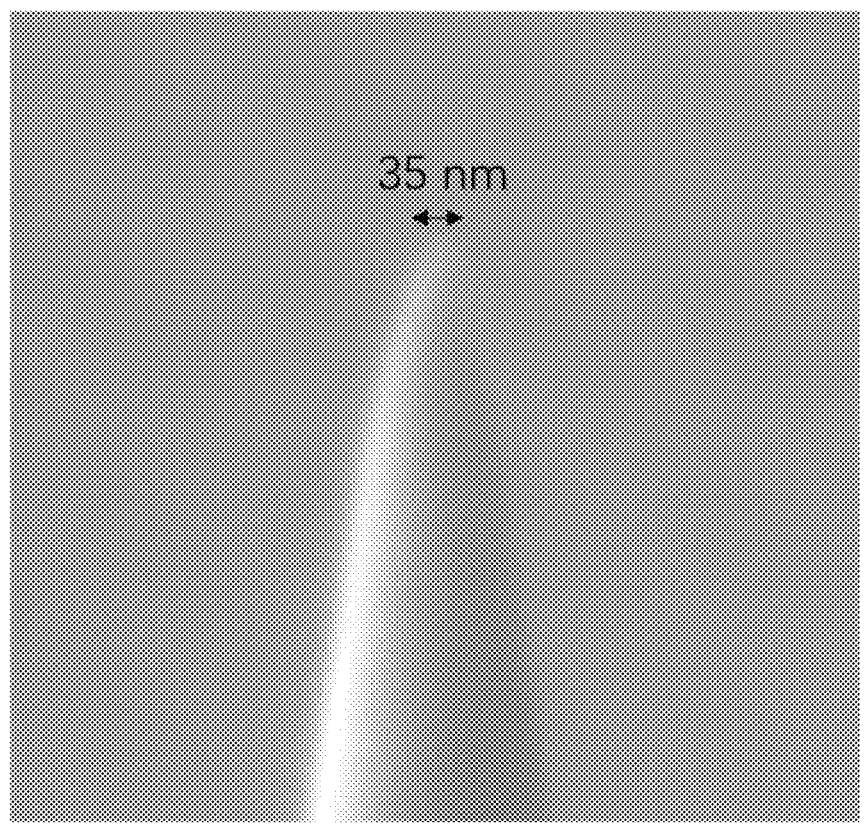
FIG. 9 is a SEM image of the nanoneedle made of a $LaB_6$ single crystal, prepared in Example 1.

FIG. 9 is a scanning electron microscope (SEM) image of the obtained nanoneedle.

From the SEM image of FIG. 9, the width of the end of the nanoneedle was 35 nm. The radius of curvature $r_N$ of the tip of this end was about 20 nm, which was a value of 2.0% of the length $d_N$ (about 1 μm) of the nanoneedle in the lateral direction. The length $L_N$ of the nanoneedle in the longitudinal direction was about 2 μm.

Figure 10:
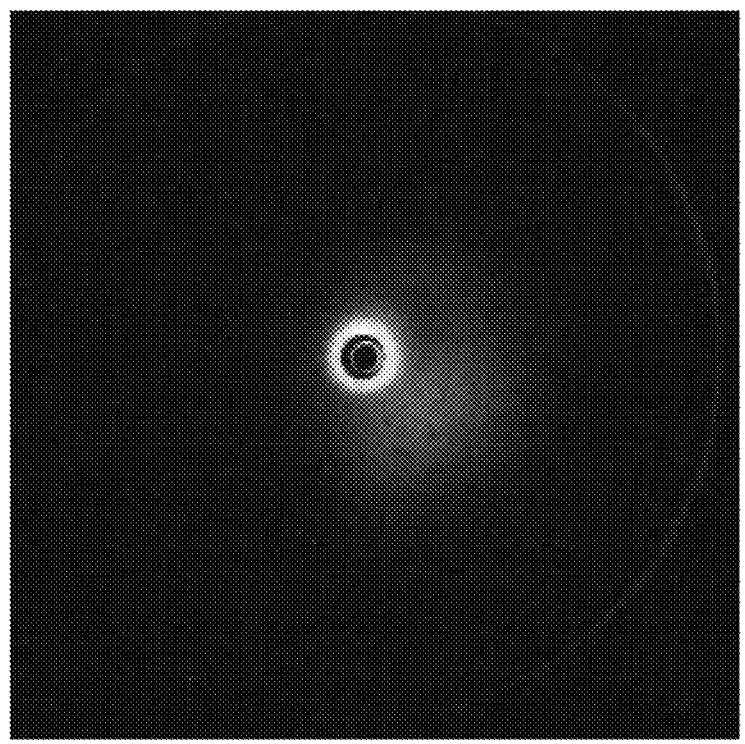
FIG. 10 is an FEM image of the nanoneedle made of a $LaB_6$ single crystal, prepared in Example 1.

In addition, from the FEM image of the obtained nanoneedle, the field electron emission pattern at the end of the nanoneedle was confirmed to be a single spot (FIG. 10).

Next, the field emission current of the emitter thus obtained (the emitter including the nanoneedle and the support needle) was measured at room temperature and an extraction voltage of 177 V to 200 V using a field ion microscope (FIM). In the measurement, the surface of the emitter (nanoneedle) was cleaned by flushing using a flash power supply connected to the electrode of the FIM.

The results are shown in FIGS. 11(a) and 11(b).

FIGS. 11(a) and 11(b) are graphs indicating field emission characteristics of the emitter according to the present example. FIG. 11(a) is a graph of the field emission current obtained by changing the extraction voltage from 177 V to 200 V in increments of 1 V (a graph indicating V-I characteristic), and FIG. 11(b) is an F-N plot (horizontal axis: reciprocal of applied voltage (1/V), vertical axis: value obtained by taking the natural logarithm of value obtained by dividing emission current by square of extraction voltage ($Ln(I/V^2)$)) obtained from the result of FIG. 11(a).

From the results of FIGS. 11(a) and 11(b), the emitter according to the present example was found to have stable field electron emission characteristics. In addition, the work function $\varphi$ of the end (portion emitting electrons) of the nanoneedle constituting the emitter according to the present example was calculated to be 2.0 eV. This result indicates that the emitter according to the present invention has excellent electron emission characteristics.

Next, the current stability of the emitter according to the present example was confirmed. The result is shown in FIG. 12.

Figure 12:
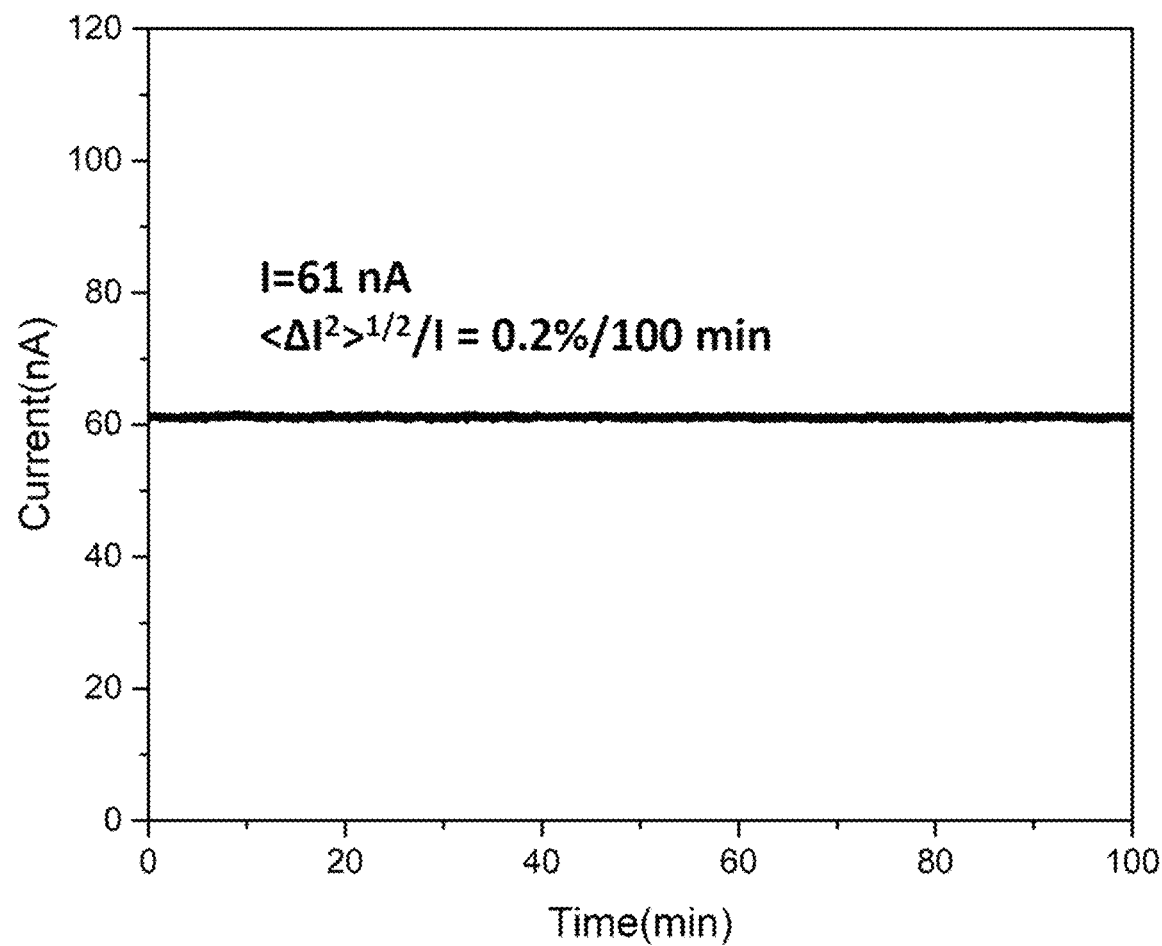
FIG. 12 is a graph indicating current stability at a current value of 61 nA (applied voltage is 187 V) for 100 minutes for an emitter according to Example 1.

FIG. 12 is a graph indicating current stability for 100 minutes at a current value of 61 nA (applied voltage: 187 V) for the emitter according to the present example.

As a result of evaluating the fluctuation of the emission current from the result of FIG. 12, the value of $<\Delta I^2>^{1/2}/I$ was 0.2%/100 min. This indicates that the emitter according to the present invention has excellent properties as a field emission electron source.

With reference to Non-Patent Literature 1, the structure and electron emission characteristics of the emitter prepared in the present example, and the emitter according to the present invention and the manufacturing method thereof will be considered.

Non-Patent Literature 1 describes $LaB_6$ tips having apex diameters of 85 nm, 15 nm, and 80 nm by a method combining electrochemical etching and focused ion beam milling. However, among these three kinds of chips, a tip 1 having an apex diameter of 85 nm is taken up on the basis of FIG. 5 (graph indicating current stability) of Non-Patent Literature 1.

Since the diameter of the apex of the tip 1 according to Non-Patent Literature 1 is 85 nm, the radius of curvature of the apex is calculated to be 42.5 nm.

On the other hand, as described above, the radius of curvature $r_N$ of the tip of the end of the nanoneedle made of the $LaB_6$ single crystal prepared in the present example is about 20 nm, which is a value significantly smaller than the apex of the tip 1 of Non-Patent Literature 1. Therefore, it can be said that the tip of the emitter according to the present invention is sharper.

According to Non-Patent Literature 1, a $LaB_6$ single crystal rod having a diameter of 0.60 mm and a length of 5 mm is fixed to a tube made from tantalum (Ta), a tungsten (W) wire having a diameter of 0.25 mm is wrapped around the Ta tube and fixed to a ceramic mount in a state where the $LaB_6$ single crystal protrudes from one end of the tube by about 2 mm, and electrochemical etching and focused ion beam milling are performed, whereby a conical structure having a length of about 20 to 30 μm and a base diameter of 2 to 5 μm can be obtained.

On the other hand, according to the method for manufacturing the emitter according to the present invention, even when, for example, a single crystal piece is cut out from a bulk single crystal as shown in the present example, a single crystal piece having a smaller size can be used. Further, by adjusting, if needed, the size of the single crystal piece before processing, the conditions of the ion beam with which the single crystal piece is irradiated, and the like, the overall shape of the nanoneedle and the shape of the end can be made into a desired shape, and the radius of curvature $r_N$ of the tip of the end, the length $d_N$ in the lateral direction, and the length $L_N$ in the longitudinal direction to desired values within the above-described preferable ranges.

According to FIG. 5 of Non-Patent Literature 1, it can be said that the tip 1 of Non-Patent Literature 1 has high current stability in comparison of the above three kinds of tips, but fluctuations (jumps) of emission current frequently occurs during measurement for 30 minutes or less. In addition, Non-Patent Literature 1 states that in the tip 1, an emission current of 10 nA was obtained at an applied voltage of 3.9 kV (3900 V).

On the other hand, in the emitter according to the present example, as described with reference to FIG. 12, the result indicating excellent current stability was obtained. Further, since an emission current of 10 nA was obtained at an applied voltage of 172 V, it can be said that the emitter according to the present invention has excellent properties as a field emission electron source.

In addition, in the emitter according to the present example, current stability for 420 minutes was confirmed under the conditions of a degree of vacuum of $1 \times 10^{-7}$ Pa and a current value of 43 nA, and the value of $\langle \Delta I^2 \rangle^{1/2}/I$ at this time was 0.4%/420 min. Further, the current stability (time) at the same degree of vacuum and at current values of about 100 nA, about 200 nA, and about 480 nA was about 130 minutes, about 25 minutes, and about 3 minutes, respectively, and the values of $\langle \Delta I^2 \rangle^{1/2}/I$ were 0.4%/130 min, 0.9%/25 min, and 0.1%/3 min, respectively.

On the other hand, according to Non-Patent Literature 1, in the tip 1 of Non-Patent Literature 1, the relative RMS noise values at a degree of vacuum of $5 \times 10^{-9}$ mbar ($5 \times 10^{-7}$ Pa) and at current values of 300 pA (0.3 nA), 500 pA (0.5 nA), 1 nA, and 5 nA are 0.2%, 0.6%, 1.1%, and 2.5%, respectively, and the measurement time is 30 minutes or less in all cases.

These results suggest that in the technique combining electrochemical etching and focused ion beam milling, which is considered to be an advantageous technique in Non-Patent Literature 1, the surface of the $LaB_6$ single crystal is contaminated and/or the stoichiometric composition of the $LaB_6$ single crystal becomes disproportional by subjecting to electrochemical etching, and these defects remain without being removed or eliminated by focused ion beam milling, whereby the performance as an emitter is impaired.

On the other hand, according to the method for manufacturing the emitter according to the present invention, the (chemically untreated) single crystal material is processed in a vacuum using the focused ion beam in an environment in which the periphery of the single crystal material fixed to the support is opened. Therefore, an emitter in which the electron emission characteristics inherent in the single crystal material are more effectively exhibited without generating defects as described above can be obtained.

[Example of Manufacturing Nanoneedle Emitter under Different Conditions]

Next, emitters were manufactured and the states of the ends of the nanoneedles were confirmed according to the following manner. That is, the end face of the $LaB_6$ single crystal piece cut out from the $LaB_6$ bulk single crystal was fixed to the support face of the tungsten needle in accordance with the same procedure as that described in Example 1, and the irradiation conditions of the ion beam using the focused ion beam (FIB) system were changed as shown in Table 1 below. In Table 1, Sample No. N1 corresponds to Example 1 described above.

TABLE 1

| Sample | Before FIB processing Single crystal material | Width*Depth*Height (μm) | | FIB processing conditions Current (pA) | Voltage (kV) | Irradiation time (min) | After FIB processing $L_N$ (μm) | $r_N$ (nm) | Ratio of radius of curvature $r_N$ to length $d_N$ in lateral direction (%) | FEM pattern |
|---|---|---|---|---|---|---|---|---|---|---|
| N1 | $LaB_6$ | 1*1*2.1 | (1) | 260 | 30 | 3 | 2 | 20 | 2.00 | single spot |
|  |  |  | (2) | 41 | 5 | 1 |  |  |  |  |
| N2 | $LaB_6$ | 5*3.5*3.8 | (1) | 230 | 30 | 10 | 3.5 | 7 | 0.20 | single spot |
|  |  |  | (2) | 41 | 5 | 5 |  |  |  |  |
| N3 | $LaB_6$ | 3*2.8*2.1 | (1) | 790 | 30 | 1 | 1.5 | 340 | 12.14 | single spot |
|  |  |  | (2) | 80 | 5 | 3 |  |  |  |  |
| N4 | $LaB_6$ | 7*5*7 | (1) | 230 | 30 | 25 | 5 | 97 | 1.94 | single spot |
|  |  |  | (2) | 20 | 5 | 5 |  |  |  |  |

As a result, in any of the samples, the field electron emission pattern at the end of the nanoneedle was confirmed to be a single spot from the FEM image of the obtained nanoneedle.

Example 2-1

In Example 2-1, an emitter was manufactured using a nanowire made of an HfC single crystal.

A nanowire made of the HfC single crystal was manufactured by a CVD method in accordance with the same procedure and conditions as those in Reference Example 1 of Patent Literature 2. From the obtained assembly of nanowires, a nanowire having a <100> crystal direction (hereinafter, such a nanowire is simply referred to as the <100> nanowire) in the growth direction (longitudinal direction) was chosen and used, and the emitter was manufactured.

From a transmission electron microscope (TEM) image, the lengths in the lateral direction of the <100> nanowires used in the present example were mostly in the range of 50 nm to 100 nm, and the lengths in the longitudinal direction were mostly 10 μm to 20 μm. In addition, the nanowire was found to be a single crystal having a <100> crystal direction from the selected area electron diffraction pattern (SAED). Furthermore, also from a high-resolution transmission electron microscope (HRTEM) image, it was confirmed that the nanowire was a single crystal, and the growth direction thereof corresponds to <100>.

The procedure of manufacturing the emitter was as follows. A commercially available emitter made of tungsten (W) having a <310> crystal direction was etched and processed into a tapered shape at one end. The tapered end was then cut and processed using the focused ion beam (FIB) system whereby a flat platform was formed. The <100> nanowire was placed on the flat platform and fixed using a carbon pad by electron beam induced deposition (EBID). As the metal support (substrate) for fixing the nanowire, tantalum (Ta), molybdenum (Mo), and other metals can be used in addition to tungsten.

Subsequently, the <100> nanowires were processed by irradiating the <100> nanowires with an ion beam using the focused ion beam (FIB) system to form the tip into a tapered shape with the following conditions.

[Irradiation conditions of ion beam] Current: 41 pA, voltage: 5 kV, irradiation position: scanning in the direction from the outer side to the inner side of the <100> nanowire, and irradiation time: 2 minutes In the processing of the <100> nanowire, the periphery of the <100> nanowire excluding the portion fixed to the metal support was set to an open environment.

Figure 13:
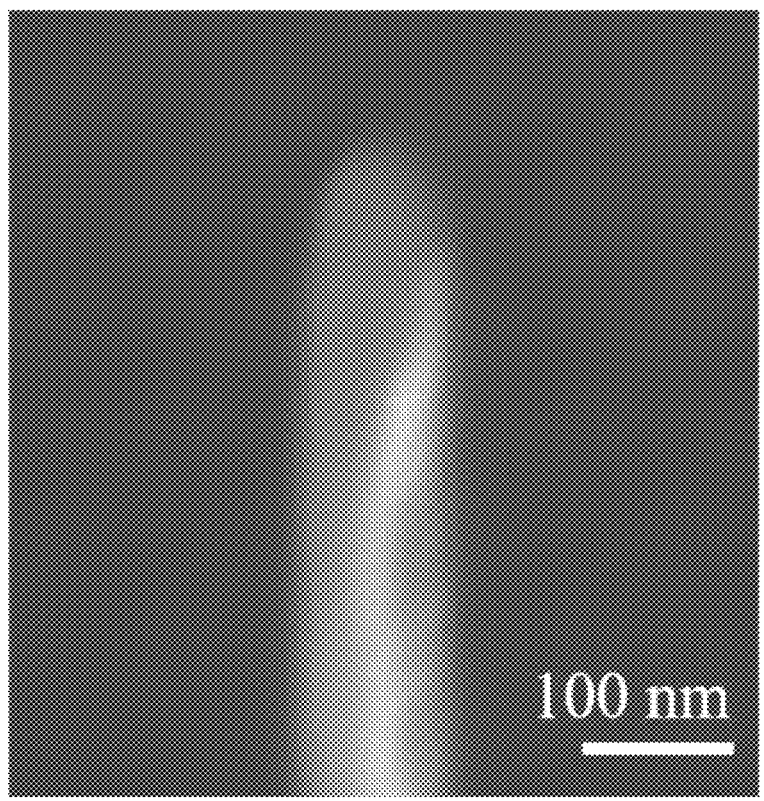
FIG. 13 is a SEM image of the nanowire made of an HfC single crystal, prepared in Example 2-1.

FIG. 13 is a scanning electron microscope (SEM) image of the obtained nanowire.

From the SEM image of FIG. 13, the radius of curvature $r_W$ of the tip of the end of the nanowire was about 40 nm, which was a value of 48.8% of the length $d_W$ (about 82 nm) of the nanowire in the lateral direction. The length $L_W$ of the nanowire in the longitudinal direction was about 6.5 μm.

Figure 14:
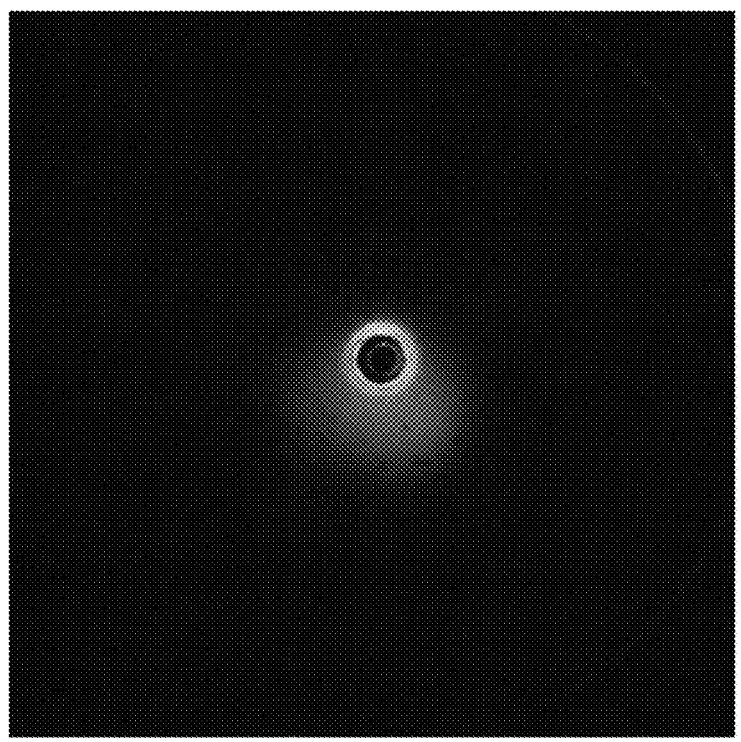
FIG. 14 is an FEM image of the nanowire made of an HfC single crystal, prepared in Example 2-1.

In addition, from the FEM image of the obtained nanowire, the field electron emission pattern at the end of the nanowire was confirmed to be a single spot (FIG. 14).

Next, the field emission current of the emitter thus obtained was measured at room temperature and an extraction voltage of 527 V to 615 V in a high vacuum chamber. In the measurement, the surface of the emitter (nanowire) was cleaned by flushing using a flash power supply connected to the electrode of the measuring device.

The results are shown in FIGS. 15(a) and 15(b).

FIGS. 15(a) and 15(b) are graphs indicating field emission characteristics of the emitter according to the present example. FIG. 15(a) is a graph of the field emission current obtained by changing the extraction voltage from 527 V to 615 V in increments of 2 V (a graph indicating V-I characteristic), and FIG. 15(b) is an F-N plot (horizontal axis: reciprocal of applied voltage (1/V), vertical axis: value obtained by taking the natural logarithm of value obtained by dividing emission current by square of extraction voltage ($Ln(I/V^2)$)) obtained from the result of FIG. 15(a).

From the results of FIGS. 15(a) and 15(b), the emitter according to the present example was found to have stable field electron emission characteristics. In addition, the work function φ of the end (portion emitting electrons) of the nanowire constituting the emitter according to the present example was calculated to be 2.7 eV. This result indicates that the emitter according to the present invention has excellent electron emission characteristics.

Next, the current stability of the emitter according to the present example was confirmed. The result is shown in FIG. 16.

Figure 16:
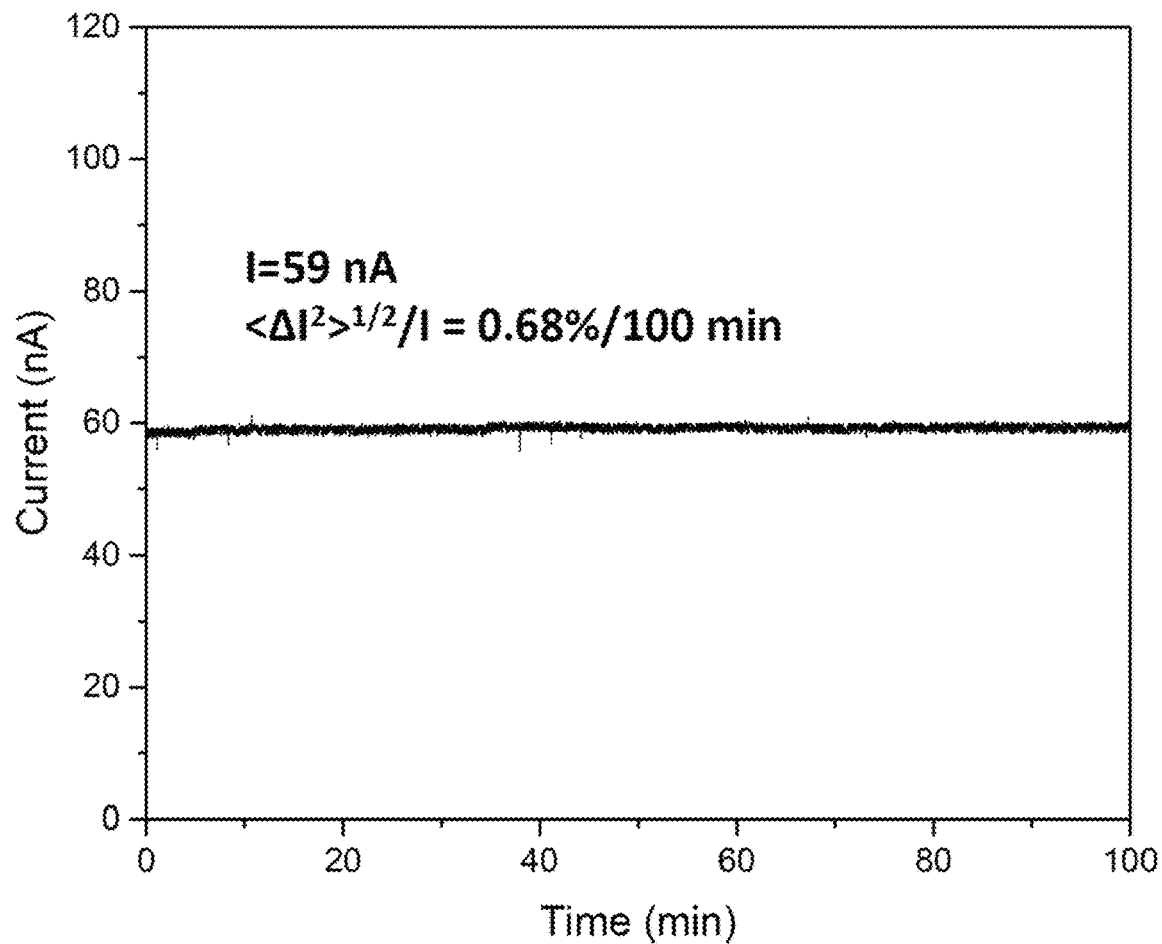
FIG. 16 is a graph indicating current stability at a current value of 59 nA (applied voltage is 590 V) for 100 minutes for an emitter according to Example 2-1.

FIG. 16 is a graph indicating current stability for 100 minutes at a current value of 59 nA (applied voltage: 590 V) for the emitter according to the present example.

As a result of evaluating the fluctuation of the emission current from the result of FIG. 16, the value of $<\Delta I^2>^{1/2}/I$ was 0.68%/100 min. This indicates that the emitter according to the present invention has excellent properties as a field emission electron source.

Example 2-2

In Example 2-2, an emitter was manufactured using a nanowire made of a $GdB_{44}Si_2$ single crystal.

Figure 17:
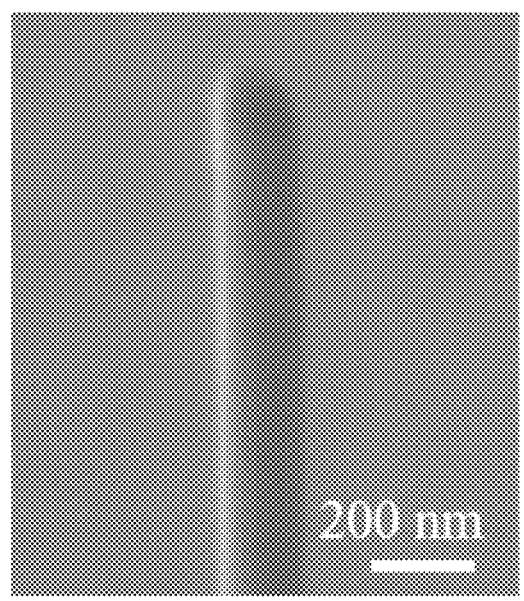
FIG. 17 is a SEM image of the nanowire made of a $GdB_{44}Si_2$ single crystal, prepared in Example 2-2.

The procedure of manufacturing the emitter was similar to that in Example 2-1. Provided, however, that the irradiation conditions of an ion beam using the focused ion beam (FIB) system are as follows:

[Irradiation conditions of ion beam] Current: 80 pA, voltage: 5 kV, irradiation position: scanning in the direction from the outer side to the inner side of $GdB_{44}Si_2$ nanowire, and irradiation time: 40 seconds FIG. 17 is a scanning electron microscope (SEM) image of the obtained nanowire.

From the SEM image of FIG. 17, the radius of curvature $r_W$ of the tip of the end of the nanowire was about 60 nm, which was a value of 34.3% of the length $d_W$ (about 175 nm) of the nanowire in the lateral direction. The length $L_W$ of the nanowire in the longitudinal direction was about 12 μm.

In addition, from the FEM image of the obtained nanowire, the field electron emission pattern at the end of the nanowire was confirmed to be a single spot.

Next, the field emission current of the emitter thus obtained was measured at room temperature and an extraction voltage of 825 V to 900 V in a high vacuum chamber. In the measurement, the surface of the emitter (nanowire) was cleaned by flushing using a flash power supply connected to the electrode of the measuring device.

The results are shown in FIGS. 18(a) and 18(b).

FIGS. 18(a) and 18(b) are graphs indicating field emission characteristics of the emitter according to the present example. FIG. 18(a) is a graph of the field emission current obtained by changing the extraction voltage from 825 V to 900 V in increments of 5 V (a graph indicating V-I characteristic), and FIG. 18(b) is an F-N plot (horizontal axis: reciprocal of applied voltage (1/V), vertical axis: value obtained by taking the natural logarithm of value obtained by dividing emission current by square of extraction voltage ($Ln(I/V^2)$)) obtained from the result of FIG. 18(a).

From the results of FIGS. 18(a) and 18(b), the emitter according to the present example was found to have stable field electron emission characteristics. In addition, the work function φ of the end (portion emitting electrons) of the nanowire constituting the emitter according to the present example was calculated to be 2.3 eV. This result indicates that the emitter according to the present invention has excellent electron emission characteristics.

Next, the current stability of the emitter according to the present example was confirmed. The result is shown in FIG. 19.

Figure 19:
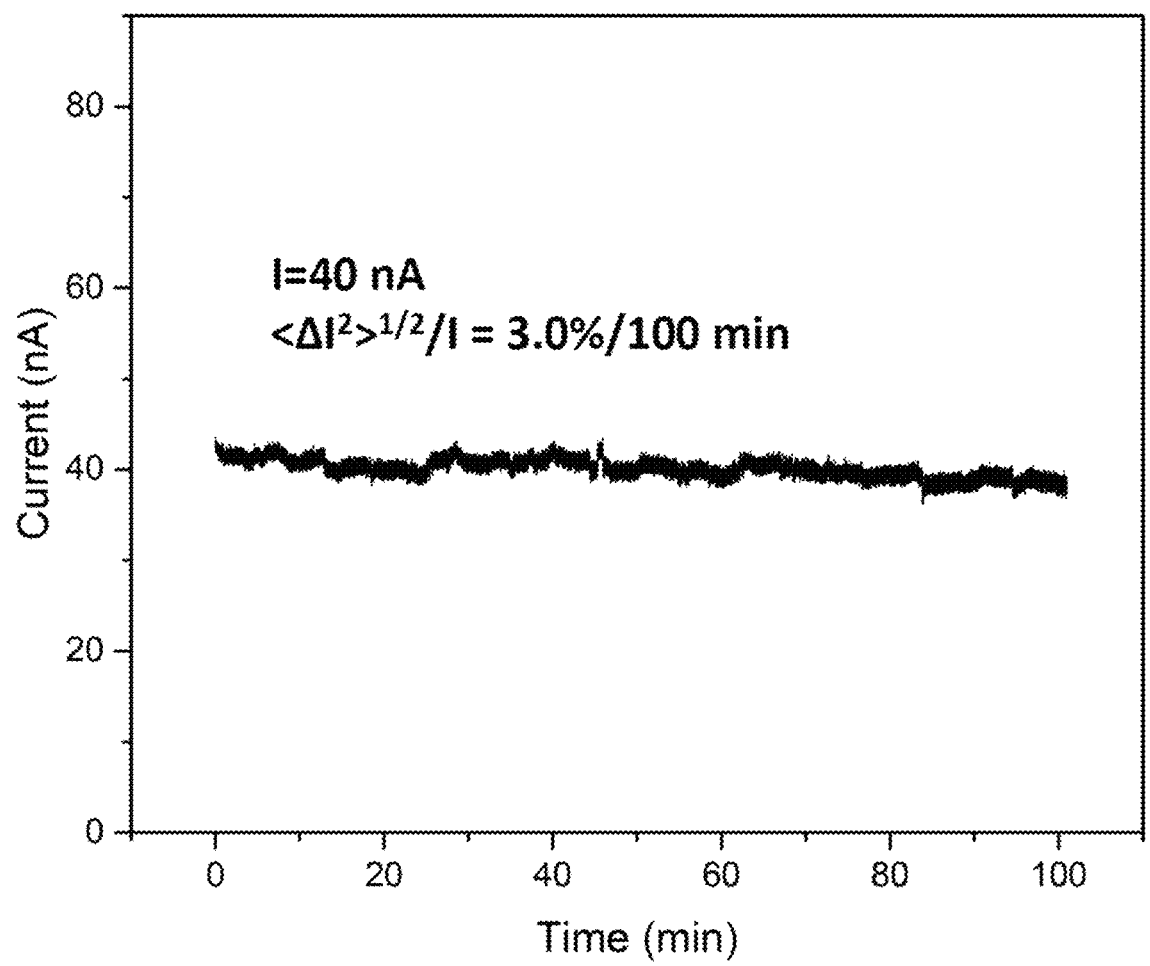
FIG. 19 is a graph indicating current stability at a current value of 40 nA (applied voltage is 895 V) for 100 minutes for an emitter according to Example 2-2.

FIG. 19 is a graph indicating current stability for 100 minutes at a current value of 40 nA (applied voltage: 895 V) for the emitter according to the present example.

As a result of evaluating the fluctuation of the emission current from the result of FIG. 19, the value of $<\Delta I^2>^{1/2}/I$ was 3.0%/100 min. This indicates that the emitter according to the present invention has excellent properties as a field emission electron source.

As described above, according to the method for manufacturing the emitter according to the present invention, the single crystal nanowire is processed in a vacuum using the focused ion beam in an environment in which the periphery of the single crystal nanowire fixed to the metal support is opened, whereby an emitter in which the electron emission characteristics inherent in the single crystal material are more effectively exhibited can be obtained.

[Example of Manufacturing Nanowire Emitter under Different Conditions]

Next, emitters were manufactured and the states of the ends of the nanowires were confirmed according to the following manner. That is, <100> nanowires having different lengths in the longitudinal direction and in the lateral direction were chosen and used from an assembly of nanowires made of an HfC single crystal prepared in accordance with the same procedure and conditions as those described in Example 2-1, the irradiation conditions of the ion beam using the focused ion beam (FIB) system were changed as shown in Table 2 below. In Table 2, Sample Nos. W1 and W2 correspond to Examples 2-1 and 2-2, respectively.

sion electron microscope, a scanning transmission electron microscope, an electron diffractometer, an Auger electron spectrometer, an electron energy loss spectrometer, and an energy dispersive electron spectrometer.

REFERENCE SIGNS LIST

100 Nanoneedle
110 Single crystal material
120 End through which electrons are to be emitted
200 Nanowire
210 Single crystal material
220 End through which electrons are to be emitted
310 Single crystal material (single crystal nanowire)
320 Support (metal support)
330 End through which electrons are to be emitted
340 End face
350 Support face
360 End
400A, 400B Electron gun
410 Emitter
420 Filament
430 Support needle
440 Electrode
450 Extraction power supply
460 Extraction electrode
470 Acceleration power supply
480 Acceleration electrode
$L_N$ Length of nanoneedle in longitudinal direction
$d_N$ Length of nanoneedle in lateral direction (diameter)
$r_N$ Radius of curvature of tip of end of nanoneedle, through which electrons are to be emitted

TABLE 2

| | | Before FIB processing | | FIB processing conditions | | | After FIB processing | | Ratio of radius of curvature $r_W$ to length $d_W$ in lateral direction (%) | FEM pattern |
|---|---|---|---|---|---|---|---|---|---|---|
| Sample | Single crystal nanowire | $L_W$ (μm) | $d_W$ (nm) | Current (pA) | Voltage (kV) | Irradiation time (s) | $L_W$ (μm) | $r_W$ (nm) | | |
| W1 | HfC | 6.5 | 82 | 41 | 5 | 120 | 6.5 | 40 | 48.78 | single spot |
| W2 | GdB$_{44}$Si$_2$ | 12 | 175 | 80 | 5 | 40 | 12 | 60 | 34.29 | single spot |
| W3 | HfC | 2.6 | 81 | 80 | 2 | 90 | 2.6 | 5 | 6.17 | single spot |

As a result, in any of the samples, the field electron emission pattern at the end of the nanowire was confirmed to be a single spot from the FEM image of the obtained nanowire.

INDUSTRIAL APPLICABILITY

According to the method for manufacturing the emitter according to the present invention, an emitter having a sharp tip can be manufactured more easily. In addition, by adjusting the processing conditions using the focused ion beam, an emitter having a desired size and shape can be easily manufactured with good reproducibility, and thus this manufacturing method is excellent in mass productivity of emitters.

When the emitter according to the present invention is used, electrons can be efficiently and stably emitted, and thus the emitter according to the present invention can be employed in any device having an electron focusing capability, such as a scanning electron microscope, a transmission electron microscope, a transmis- $L_W$ Length of nanowire in longitudinal direction
$d_W$ Length of nanowire in lateral direction (diameter)
$r_W$ Radius of curvature of tip of end of nanowire, through which electrons are to be emitted

The invention claimed is:

1. A method for manufacturing an emitter, the method comprising:
   processing a single crystal material in a vacuum using a focused ion beam to form an end of the single crystal material, through which electrons are to be emitted, into a tapered shape, the processing being performed in an environment in which a periphery of the single crystal material fixed to a support is opened,
   wherein the processing the single crystal material comprises setting a radius of curvature $r_N$ of a tip of the end to a value of 80% or less of a length $d_N$ of the single crystal material in a lateral direction.

2. The method according to claim 1, wherein the single crystal material is chemically untreated.

3. The method according to claim 1, wherein an end face opposite to the end of the single crystal material is fixed to a support face of the support.

4. The method according to claim 1, wherein in the processing the single crystal material, the single crystal material is thinned toward the end by setting irradiation conditions of the focused ion beam such that a current is 200 to 800 pA, a voltage is 20 to 40 kV, a position to be irradiated is moved scanning in a direction from an outer side to an inner side of the single crystal material, and irradiation time is 0.5 to 30 minutes, and thereafter the radius of curvature $r_N$ of the tip of the end is set to a value of 20% or less of the length $d_N$ of the single crystal material in the lateral direction by setting the irradiation conditions of the focused ion beam such that a current is 10 to 100 pA, a voltage is 2 to 10 kV, a position to be irradiated is moved scanning in a direction from an outer side to an inner side of the single crystal material, and irradiation time is 0.5 to 10 minutes.

5. An emitter comprising a nanoneedle made of a single crystal material,
wherein the nanoneedle has an inevitable oxide layer at a surface layer portion,
wherein a portion of the nanoneedle underlying the inevitable oxide layer at the surface layer portion has no change in a stoichiometric composition from the single crystal material, and
a field electron emission pattern, obtained by a field emission microscope (FEM), at an end of the nanoneedle, through which electrons are to be emitted, is a single spot.

6. The emitter according to claim 5, wherein the nanoneedle is manufactured by a method comprising:
processing the single crystal material in a vacuum using a focused ion beam to form an end of the single crystal material, through which electrons are to be emitted, into a tapered shape, the processing being performed in an environment in which a periphery of the single crystal material fixed to a support is opened.

7. The emitter according to claim 5 further comprising: a support needle,
wherein an end face opposite to the end of the nanoneedle is fixed to a support face of the support needle made of an element selected from the group consisting of tungsten (W), tantalum (Ta), platinum (Pt), rhenium (Re), and carbon (C).

8. The emitter according to claim 5, wherein the single crystal material is a rare-earth hexaboride.

9. An electron gun comprising at least the emitter according to claim 5.

10. The electron gun according to claim 9,
wherein the emitter further comprises a support needle and a filament, and
the nanoneedle is attached to the filament via the support needle made of an element selected from the group consisting of tungsten (W), tantalum (Ta), platinum (Pt), rhenium (Re), and carbon (C).

11. The electron gun according to claim 9, wherein the electron gun is a cold cathode field emission electron gun or a Schottky electron gun.

12. An electronic device comprising an electron gun, wherein the electron gun is the electron gun according to claim 9, and
the electronic device is selected from the group consisting of a scanning electron microscope, a transmission electron microscope, a scanning transmission electron microscope, an electron diffractometer, an Auger electron spectrometer, an electron energy loss spectrometer, and an energy dispersive electron spectrometer.

13. A method for manufacturing an emitter, the method comprising:
processing a single crystal material in a vacuum using a focused ion beam to form an end of the single crystal material, through which electrons are to be emitted, into a tapered shape, the processing being performed in an environment in which a periphery of the single crystal material fixed to a support is opened,
wherein the single crystal material is a single crystal nanowire, and
wherein the processing the single crystal material comprises setting a radius of curvature $r_w$ of a tip of the end to a value of 50% or less of a length $d_w$ of the single crystal nanowire in a lateral direction.

14. The method according to claim 13, wherein in the processing the single crystal material, the single crystal nanowire is thinned toward the end, and the radius of curvature $r_w$ of the tip of the end is set to a value of 50% or less of the length $d_w$ of the single crystal nanowire in the lateral direction, by setting irradiation conditions of the focused ion beam such that a current is 20 to 100 pA, a voltage is 2 to 10 kV, a position to be irradiated is moved scanning in a direction from an outer side to an inner side of the single crystal nanowire, and irradiation time is 0.5 to 5 minutes.

15. An emitter comprising a single crystal nanowire manufactured by the method according to claim 10,
wherein a field electron emission pattern, obtained by a field emission microscope (FEM), at an end of the single crystal nanowire, through which electrons are to be emitted, is a single spot.

16. The emitter according to claim 15, wherein the single crystal nanowire is made of a metal carbide, a rare-earth boride, or a metal oxide.

17. The emitter according to claim 16, wherein the single crystal nanowire is made of hafnium carbide (HfC).

18. An electron gun comprising at least the emitter according to claim 15.

19. The electron gun according to claim 18,
wherein the emitter further comprises a support needle and a filament, and
the single crystal nanowire is attached to the filament via the support needle made of an element selected from the group consisting of tungsten (W), tantalum (Ta), platinum (Pt), rhenium (Re), and carbon (C).

20. The electron gun according to claim 18, wherein the electron gun is a cold cathode field emission electron gun or a Schottky electron gun.

21. An electronic device comprising an electron gun,
wherein the electron gun is the electron gun according to claim 18, and
the electronic device is selected from the group consisting of a scanning electron microscope, a transmission electron microscope, a scanning transmission electron microscope, an electron diffractometer, an Auger electron spectrometer, an electron energy loss spectrometer, and an energy dispersive electron spectrometer.

* * * * *